United States Patent [19]
Yasuzato et al.

[11] Patent Number: 6,004,699
[45] Date of Patent: Dec. 21, 1999

[54] PHOTOMASK USED FOR PROJECTION EXPOSURE WITH PHASE SHIFTED AUXILIARY PATTERN

[75] Inventors: Tadao Yasuzato; Shinji Ishida, both of Tokyo, Japan

[73] Assignee: NEC Corporation, Tokyo, Japan

[21] Appl. No.: 09/031,107

[22] Filed: Feb. 26, 1998

[30] Foreign Application Priority Data

Feb. 28, 1997 [JP] Japan .................................. 9-046340

[51] Int. Cl.⁶ ...................................................... G03F 9/00
[52] U.S. Cl. .................................................................. 430/5
[58] Field of Search ..................................................... 430/5

[56] References Cited

FOREIGN PATENT DOCUMENTS

| | | |
|---|---|---|
| 57-62052 | 4/1982 | Japan . |
| 315845 | 1/1991 | Japan . |
| 4136854 | 5/1992 | Japan . |
| 4268714 | 9/1992 | Japan . |
| 5333524 | 12/1993 | Japan . |
| 777796 | 3/1995 | Japan . |
| 8194303 | 7/1996 | Japan . |

*Primary Examiner*—Christopher G. Young
*Attorney, Agent, or Firm*—Hayes Soloway Hennessey Grossman & Hage PC

[57] ABSTRACT

A photomask used for a projection exposure equipment comprises a transparent substrate and a light intercepting film provided on the transparent substrate. The transparent substrate comprises a main pattern region and an auxiliary pattern region provided in a periphery of the main pattern region. The auxiliary pattern region is etched to a depth at which a phase difference arises between light transmitted through the main pattern and light transmitted through the auxiliary pattern. The phase difference is of substantially an integral number of times as large as 360 degrees, wherein the integral number is one selected from the group consisting of integral numbers of one or more and integral numbers of minus one or less. The light intercepting film comprises openings on the main pattern region and the auxiliary pattern region.

17 Claims, 25 Drawing Sheets

F I G. 23
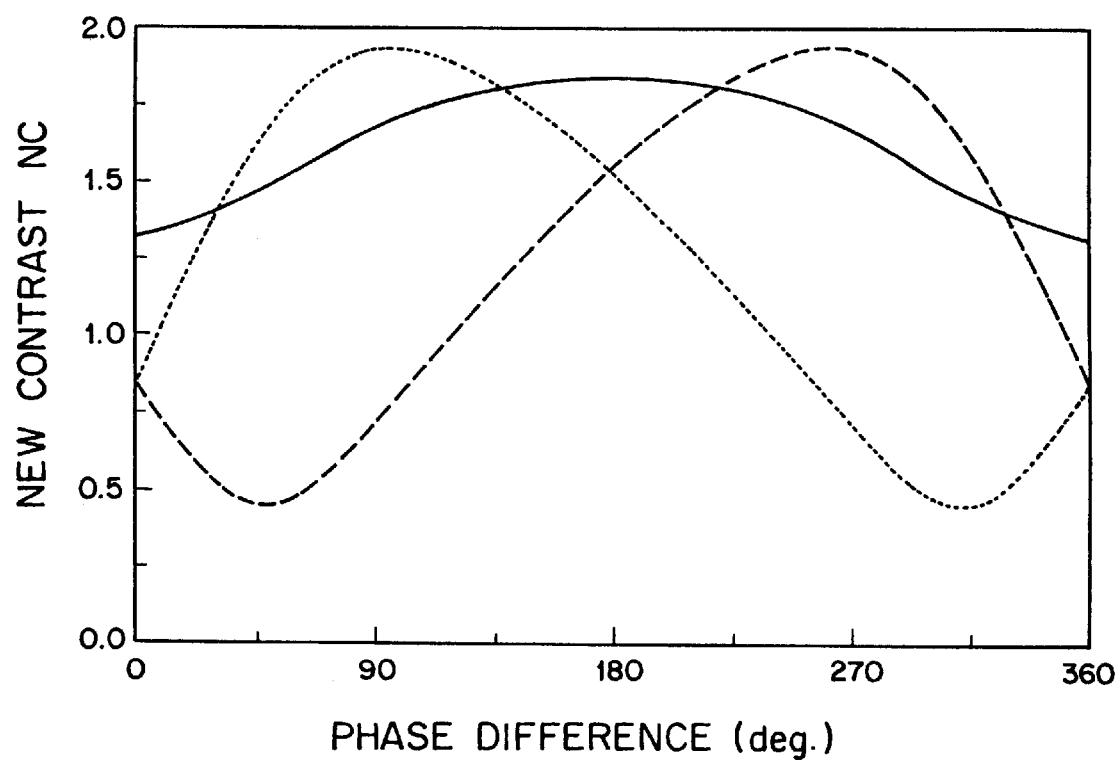

PHOTOMASK USED FOR PROJECTION EXPOSURE WITH PHASE SHIFTED AUXILIARY PATTERN

BACKGROUND OF THE INVENTION

1. Field of the Invention

The present invention relates to a photomask used for a projection exposure equipment and more particularly, to a photomask used to form a fine pattern in a semiconductor device fabrication process.

2. Description of the Related Art

Recently, optical lithography has been a mainstay in forming a pattern on a semiconductor substrate in a semiconductor device fabrication process.

In an optical lithographic process, first a pattern formed on a photomask is transferred to photosensitive resin coated on a semiconductor substrate surface by a reduction projection exposure equipment. The photosensitive resin is patterned to a predetermined pattern in development. A pattern formed on a photomask comprises a transparent region and a light-intercepting region. A photomask is an original plate for exposure on which such a pattern is formed and it is called a reticle when a size ratio between patterns formed thereon and on photosensitive resin is not 1:1.

Miniaturization of a pattern for a semiconductor device has recently been demanded and in a conventional photolithographic technology, such a demand has been satisfied with development of an exposure equipment, especially with a higher numerical aperture (NA) in a projection lens system. Numerical aperture is an index showing a power to collect spread optical rays and the higher the value, the higher the performance of a lens since more spread optical rays can be collected.

The following mathematical formula (1) is established between the limit R of a resolution, that is the minimum dimension of a fine pattern with which images can be separated, and a numerical aperture NA, as a Rayleigh formula, which is:

$$R = (K_1 \times \lambda)/NA \quad (1)$$

where $K_1$ is a constant which depends on process parameters, such as a performance of photosensitive resin and the like, and k is wavelength of transmitted light. As can be seen from the formula (1), as a value of a numerical aperture NA is larger, the resolution limit R is smaller.

A resolution can be improved by increasing a numerical aperture of an exposure equipment but since a depth of focus is decreased with the increase in resolution, there arises difficulty in miniaturization of a pattern. A depth of focus is an index showing an allowable range of a displacement of a focal point. The following mathematical formula (2) is established between a depth of focus DOF and a numerical aperture NA, as a Rayleigh formula, which is:

$$DOF = (K_2 \times \lambda)/NA^2 \quad (2)$$

where $K_2$ is a constant depending on process parameters. As can be seen from the formula (2), as a numerical aperture NA is larger, a depth of focus is smaller and thereby even a slight displacement of a depth of focus cannot be allowed.

For those reasons, various superresolution methods have been studied in order to increase a depth of focus. A superresolution method is a method in which an optical intensity distribution on an image plane is improved by controlling an illumination optical system, a photomask, or a transmittance or a phase in at a pupil plane of a projection lens system.

So-called off-axis illumination method, which is a method to improve resolution characteristics by optimization of an illumination optical system, has recently drawn attention among various superresolution methods, since it is nearest a reality.

Description will be given on an illumination optical system for an ordinary exposure equipment called a stepper.

In a lithographic process to fabricate a semiconductor device, all the surface of an exposure region on a photomask is required to be illuminated with a uniform intensity in order to control a size of a pattern formed across all the surface of an exposure region of a semiconductor substrate. For this reason, in the ordinary exposure equipment, light emitted from a mercury lamp as a light source is made to pass a cold mirror, an interference filter and the like to have a single wavelength. The light with a single wavelength is guided to a fly's eye lens, which is an optical element for obtaining a uniformity of illumination.

A fly's eye lens is an optical element that comprises a bundle of plural single lenses of the same type aligned in parallel. Each single lens forms a focus point and thereby plural independent point light sources are formed in such a fly's eye lens. When a photomask is illuminated by such a group of point light sources constructed by the point light sources, a uniformity of illumination across the photomask is improved. Sometimes, such a group of point light sources is called a secondary light source, while a mercury lamp is a primary light source.

When light emitted from the mercury lamp is made to pass a fly's eye lens, a state of illumination on a photomask comes to be not affected by a emission state of the mercury lamp as a light source. That is, an illumination state on a photomask is substantially only by a shape and an intensity distribution of a point light source formed by the fly's eye lens, which influences exposure characteristics. This point light source group is called an effective light source from the characteristics.

A method to improve resolution characteristics by controlling a shape of the effective light source is a superresolution method which is generally called off-axis illumination method or an oblique illumination method.

In order to change of a shape of the effective light source, a diaphragm or a filter of one of various forms is generally disposed immediately after a fly's lens. This method is further classified by forms of a diaphragm of the effective light source. For example, an illumination method in which light is intercepted in the middle portion of a diaphragm to form a ring type illumination light source is called annular illumination method, and an illumination method in which a diaphragm having four openings at peripheral four corners is used, is called quadrupole illumination method.

Off-axis illumination method will be described. FIG. 1A is a typical view showing a diaphragm used in an ordinary illumination method which does not employ the off-axis illumination method, FIG. 1B is a typical view showing a main optical system of the exposure equipment as same as FIG. 1A. FIG. 1C is a typical view showing a diaphragm used in illumination method employing the off-axis illumination method and FIG. 1D is a typical view showing a main optical system of the exposure equipment as same as FIG. 1C.

In the ordinary illumination method, as shown in FIG. 1A, a diaphragm 201a which has a circular opening is used. As shown in FIG. 1B, light output from a fly's eye lens 202 is contracted by the diaphragm 201a and projected on a photomask 203 substantially normal to the surface thereof. Then, light is diffracted by the photomask 203 and guided to a projection lens system 204. Light is projected to a semiconductor substrate 205 from the projection lens system 204.

In order that a pattern formed on the photomask 203 is resolved, at least diffracted light of the zero order and plus first order or minus first order are required to be collected from diffracted light. However, in the ordinary illumination method, as shown in FIG. 1B, as a pattern is finer, a diffraction angle is larger and thereby neither of diffracted light of the plus first order and diffracted light of the minus first order is projected into the projection lens system 204.

Therefore, in a fine pattern, light which is projected on the photomask 203 in a direction normal to the surface thereof becomes a noise component which does not contribute to resolution and thus decreases a contrast of a light intensity distribution on an image plane.

On the other hand, in off-axis illumination method, as shown in FIG. 1C, a diaphragm 201b having an opening of a ring like shape is used. As shown in FIG. 1D, incident light is projected on the photomask 203 along a direction oblique to the surface thereof and diffracted light of the zero order and the plus first order or minus first order are projected into the projection lens system 204, so that a majority of illumination light is used for resolution of a pattern.

In such a manner, according to off-axis illumination method, a vertically incident component of illumination light which component does not contribute to resolution is removed and obliquely incident light is effectively utilized, so that improvements on resolution and a depth of focus can be achieved.

However, while off-axis illumination method is effective for formation of a periodic pattern such as produces diffracted light, no effect is exerted on formation of an isolated pattern by which diffraction of light does not occur.

In consideration of such a condition, there is disclosed a photomask in which a fine pattern region not to be resolved is provided in the peripheral region surrounding a main pattern region to be resolved, when an isolated pattern is formed (Japanese Unexamined Patent Publication (Kokai) No. Hei 4-268714). This fine pattern region is hereinafter referred to as an auxiliary pattern region.

A conventional auxiliary pattern region will be described. FIG. 2A is a plan view showing a structure of a conventional auxiliary pattern region and FIG. 2B is a sectional view taken on line A—A of FIG. 2A.

In this case, it is assumed that there is employed an KrF excimer laser exposure equipment in which a ratio of a size of a pattern region on a photomask vs. a size of a pattern on an image plane is 5:1, that is a reducing magnification is one-fifth (⅕), a numerical aperture NA is 0.55 and a coherence factor σ is 0.8. A pattern formed on a surface of a semiconductor substrate, which is an image plane, is an isolated pattern of 0.2 μm.

In a conventional photomask applied with an auxiliary pattern region, as shown in FIGS. 2A and 2B, a light intercepting film 217 made of a chromium film of 70 nm thick and a chromium oxide film of 30 nm thick is formed on a transparent substrate 216 made of quartz. A main pattern region 211 having a width $W_1$ of 1.00 μm is formed in the light intercepting film 217. This main pattern region 211 is an isolated pattern on an image plane. Auxiliary pattern regions 212 having a width $W_2$ of 0.5 μm are formed in the light intercepting film 217 with a distance of 1.25 μm from the main pattern region 211 in the left and right side thereof as viewed. In this case, a distance between the main pattern region 211 and an auxiliary region 212 is set so that a pitch of a pattern is equal to a lines and spaces pattern of 0.2 μm. That is, a pitch on an image plane is 0.4 μm and a pitch on a photomask is 2.0 μm. A width $W_2$ of an auxiliary pattern region 212 is set so that the auxiliary pattern region 212 is not to be transferred.

It is clear that as a width $W_2$ of an auxiliary pattern region 212 is larger, the effect thereof is larger. However, if the magnitude is in excess of a predetermined value, an auxiliary pattern region 212 itself is transferred onto the semiconductor substrate and sometimes affects a function of the semiconductor device in a wrong manner.

Therefore, an auxiliary pattern region 212 is required to set in such a manner that it may not be transferred by considering various factors, such as a variation of a width $W_2$ of the auxiliary pattern region caused due to errors in fabrication of a photomask, a variation in an exposure dose when the photomask is used and the like.

If a photomask having such an auxiliary pattern region 212 is used, a depth of focus on an isolated pattern can be larger and the depth of focus is further increased under combination with off-axis illumination method.

In addition to the above mentioned off-axis illumination method, a phase shift mask, which is one of the superresolution method, and which is an improvement on the side of a photomask, is greatly studied.

As a phase shift mask, there is proposed Shibuya-Levenson method, that is a method in which a phase of light transmitted through transparent regions alternately changed by 180 degree in a periodic pattern (Japanese Unexamined Patent Publication (Kokai) No. Sho 57-62052). FIG. 3A is a plan view showing a structure of a Shibuya-Levenson phase shift mask, FIG. 3B is a sectional view taken on line B—B of FIG. 3A and FIG. 3C is a typical diagram showing a amplitude distribution of transmitted light of the phase shift mask.

In the phase shift mask, as shown in FIGS. 3A and 3B, an light intercepting film 227 is formed on a transparent substrate 226 and openings 221 are periodically fabricated in the light intercepting film 227 by selectively removing parts thereof. Transparent films 223 are provided in every other opening 221.

A wavelength of light λ becomes λ/n in a material in which it is transmitted, where n is a refractive index of the material. Therefore, there arises a phase difference between light that is transmitted through the air, whose refractive index is about 1, and light that is transmitted through the transparent film 223. In a Shibuya-Levenson phase shift mask, a phase shift is adjusted to be 180 degree by setting a film thickness t of the transparent film 223 to be $\lambda/2(n_1-1)$. Here, λ indicates a wavelength of exposure light and $n_1$ indicates a refractive index of the transparent film 223.

When a phase difference between light transmitted through the air and light transmitted through the transparent film 223 is set 180 degree, an amplitude distribution of a transmitted light through a phase shift mask by Shibuya-Levenson method has a distribution in which phases are reversed in every other opening as shown in FIG. 3C. Thereby, in this case, a period of the amplitude distribution is twice as large as that in the case where the phase shift mask is not applied. Therefore, a diffraction angle of a phase shift mask is ½ as large as so far and even a pattern which is outside the limit of resolution, the diffraction light is collected into a projection lens.

Since an interference between light beams whose phases are in a reversed relation and light intensity is decreased between adjacent openings, a fine pattern can be separated.

The transparent film 223 is called a phase shifter and a silicon oxide ($SiO_2$) film is generally used as the material.

However, in this case, selective etching is hard to be performed between the transparent film 223 and the transparent substrate 223 made of quartz ($SiO_2$). For this reason, an etching stopper is required to provide between the phase shifter and the transparent substrate in a Shibuya-Levenson phase shift mask.

However, while with a g-line (wavelength: 436 nm) and an i-line (wavelength: 356 nm) of a mercury lamp, a transmittance of tin oxide and the like is 100% and there is available an etching stopper having light resistance, with KrF excimer laser light (wavelength: 248 nm), there is not available any proper etching stopper.

In such circumstances, a study on a phase shift mask having a structure in which a phase difference is produced has been started for KrF exposure by etching a transparent substrate itself without disposing a phase shifter on a mask. This phase shift mask is disclosed in Japanese Unexamined Patent Publication (Kokai) No. Hei 7-77796. FIG. 4 is a sectional view showing a structure of a conventional phase shift mask described in Japanese Unexamined Patent Publication (Kokai) No. Hei 7-77796. In a Shibuya-Levenson phase shift mask which is fabricated by etching a transparent substrate itself, as shown in the publication, a light intercepting film 237 in which opening patterns 231 on the transparent substrate 236, as shown in FIG. 4, is provided as in the Shibuya-Levenson shift mask shown in FIG. 3. Besides, the transparent substrate 236 is etched and thereby an etching step portion 233 is formed in a position aligning with an opening pattern 231. In this conventional example, the etching step portion 233 works as a phase shifter.

In such a manner, since the phase shift mask shown in FIG. 4 does not use a etching stopper, it can also be applied to KrF exposure and exposure light of a short wavelength, such as ArF excimer laser light. Besides, since a film forming process step for a etching stopper or a phase shifter is not necessary, it has an advantage that occurrence of defects can be decreased.

However, in the case where a pattern is transferred using a phase shift mask which does not require the above mentioned etching stopper, an intensity of light from the etching step potion 233 is decreased on an image plane and thus a serious problem arose that a dimensional difference occurs between adjacent patterns.

In order to solve such a problem, a study has been performed through experiments and simulations and it has been found that the occurrence of a dimensional difference is caused by a change in phase in the vicinity of the etching step portion 233. That is, a phase of transmitted light is not clearly separated into 0 and 180 degrees on both sides at the side wall as a boundary but there is an intermediate phase region in the vicinity of the side wall. In an actual case, since there is light obliquely directed to a mask, reflection and the like occur, as well, at the side wall of the etching step portion 233, so that a more complex phase change arises. A part of light whose phase is changed in a complex manner decreases light intensity from the region.

Another method is proposed in which the side wall of an etching step portion is concealed under an light intercepting film (Japanese Unexamined Patent Publication (Kokai) No. Hei 8-194303). FIG. 5 is a sectional view showing a structure of a conventional phase shift mask described in Japanese Unexamined Patent Publication (Kokai) No. Hei 8-194303. In a phase shift mask described in the publication, a side wall 243a of an etching step portion 243 is spaced from an edge portion of an opening pattern 241 by about 0.1 $\mu$m. For this reason, all light whose phase is in disorder is intercepted by an light intercepting film 247 and only light whose phase is changed by 180 degree is made to pass through the opening. This structure can be fabricated by isotropic etching with a buffered hydrofluoric acid or the like after anisotropic etching is applied to the transparent substrate 246 with $CHF_3$ or the like.

However, the above mentioned various Shibuya-Levenson phase shift masks can only be applied to a closely packed repeated pattern. Then, there are proposed a method in which a Shibuya-Levenson phase shift mask is applied to fabrication of an isolated pattern (Japanese Unexamined Patent Publication (Kokai) No. Hei. 3-15845). A method of an auxiliary pattern method as described in the publication, too, is a method in which a fine pattern region is provided which is not resolved as in a similar manner to a photomask having an ordinary auxiliary pattern region described above. A phase difference between light transmitted through a main pattern region and light transmitted through the auxiliary pattern region is utilized to achieve a phase shift mask effect. Description will be made on a phase shift mask of an auxiliary pattern type having such a structure. FIG. 6A is a plan view showing a structure of a conventional phase shift mask of an auxiliary pattern type and FIG. 6B is a sectional view taken on line C—C of FIG. 6A. In a phase shift mask of a conventional auxiliary pattern type, as shown in FIGS. 6A and 6B, a main pattern region 251 with a width of 1.00 $\mu$m is divided in a transparent substrate 256. Auxiliary pattern regions 252 of a width of 0.5 $\mu$m are disposed on the left and right sides, as viewed, of the main pattern region 251 in a spaced manner therefrom. Besides, a light intercepting film 257 which has openings at positions above the main pattern region 251 and the auxiliary pattern regions 252 are formed on the transparent substrate 256. A transparent film 253 is formed on the auxiliary pattern regions 252. Thereby, a phase difference arises between light to be transmitted through the main pattern region 251 and light transmitted trough an auxiliary pattern region by 180 degrees.

As a method in which design and fabrication of a mask are simple, there is proposed a half tone method (Japanese Unexamined Patent Publication No. Hei 4-136854). The half tone method has been studied mainly for use in a hole pattern in its first period of development, but later, the method has been found that it has an effect on a general line pattern as well in a combination with off-axis illumination method. In a phase shift mask of a conventional half tone type described in Japanese Unexamined Patent Publication No. Hei 4-136854, a semitransparent film is provided instead of a light intercepting film that is provided for the conventional photomask shown in FIG. 1B. As a material of the semitransparent film, there is used: chromium oxynitride, molybdenum oxynitride silicide or chromium fluoride and a transmittance is commonly in the range of 4 to 10%. In a phase shift mask of a half tone type constructed in such a manner, a phase difference between light transmitted through the semitransparent film and light transmitted through a transparent region in its periphery arises by 180 degrees, and thereby an effect of the phase shift mask can be achieved.

However, in a phase shift mask of a conventional half tone type, there has been a problem in a condition of off-axis illumination that the effect of increase in depth of focus in an isolated pattern cannot be achieved.

For example, in formation of an isolated hole pattern, in a condition of an illumination of a low coherence factor σ, the effect of increase in depth of focus more than 50% can be achieved with a half tone mask, but in a condition of annular illumination, there can only available an effect of the same extent as an ordinary mask.

In a photomask having the above-mentioned auxiliary pattern, since there is necessary a fine pattern that is outside the limit of resolution, a problem arises that fabrication of a mask is difficult.

Generally in a photomask having an auxiliary pattern, as a size of the auxiliary pattern is larger, exposure characteristics of a main pattern, such as a focusing characteristic, a depth of focus and the like are improved. However, if a size of the auxiliary pattern is larger, it is transferred. For this reason, a maximum size has been selected possible in the range in which the auxiliary pattern is not transferred.

For example, in the case of a KrF excimer laser exposure equipment (numerical aperture: 0.55, coherence factor σ: 0.8, reducing magnification: ⅕), since the resolution limit is 0.2 μm or less, a pattern of 0.1 μm as an auxiliary pattern, which is half as large as that, is required. With this pattern as an auxiliary pattern, it is a pattern of 0.5 μm on a photomask, which is already lower than the limit at which a pattern can be fabricated in a stable manner in a mask drawing apparatus currently available.

Generally an electron beam pattern generator is used to draw a mask pattern and the resolution limit is on the order of 0.3 μm and a proper exposure dose is changed at a great extent depending on a pattern size.

Therefore, if an exposure dose is adjusted based on a main pattern, an exposure dose is short for requirement of an auxiliary pattern and thereby a size is narrowed by a great margin. When a size of an auxiliary pattern is narrowed in such a manner, an effect of increase in depth of focus cannot sufficiently be achieved. On the other hand, if an exposure dose is adjusted based on an auxiliary pattern, an exposure dose is excessive for requirement of a main pattern, so that an accuracy of a mask size is deteriorated.

Even when a mask pattern is managed to be fabricated in some way or the other, a problem arises in an inspection step that follows the patterning step. That is, if a detection sensitivity is held at a high level in a mask inspecting apparatus, all the auxiliary patterns are detected as a pseudo-defect.

For this reason, while in an actual case, a detection sensitivity of an inspecting apparatus is lowered so that a pseudo-defect may not be detected in operation, as a result, a weak point is brought about that a reliability of a mask is conspicuously degraded.

In light of such a problem, proposed is a phase shift mask in which formation of an auxiliary pattern is easy (Japanese Unexamined Patent Publication (Kokai) No. Hei 5-333524). FIG. 7A is a plan view showing a structure of a phase shift mask described in Japanese Unexamined Patent Publication (Kokai) No. Hei 5-333524 and FIG. 7B is a sectional view taken on line D—D of FIG. 7A. In a phase shit mask pattern of a conventional auxiliary pattern type described in the publication, a conductive film 268 made of indium tin oxide or the like is formed on a transparent substrate 266 made of quartz or the like as shown in FIGS. 7A and 7B. There is provided on the conductive film 268 a light intercepting film 267 comprising a first opening 261 formed in a line like shape and second openings 262 formed on the left and right side thereof, as viewed, equally spaced therefrom. A transparent film 263 is formed on the first opening 261 and the light intercepting film 267. For example, a width of the first opening 261 is 1.5 μm, a width of a second opening 262 is 1.5 μm and a distance between the first opening 261 and a second opening 262 is 1.5 μm. A film thickness of the transparent film 263 in the first opening 261 is set so that a difference in phase of 180 degrees may arise between light transmitted through the first opening 261 and light transmitted through a second opening 262.

In a phase shift mask fabricated in such a manner, light of the zero order transmitted through the first opening 261 and light of the zero order transmitted through a second opening 262 mutually offset by each other and thereby a contrast of an image of the first opening 261 is improved. Furthermore, since a part of light transmitted through a second opening 262 is intercepted on the side wall of the transparent film 263 and furthermore a phase difference arises in part of the light transmitted through the transparent film 263, the second opening 262 is not transferred.

When this conventional phase shift mask and a projection exposure equipment with a numerical aperture NA of 0.45, a coherence factor σ of 0.3, a reducing magnification of ⅕ and exposure light of an i-line (wavelength of 356 nm) was used to perform projection exposure, an isolated space with a width of 0.3 μm was able to be fabricated with a high accuracy.

In this conventional example, since a width of a second opening 262 which plays as an auxiliary pattern region is as large as 1.5 μm, generation of an auxiliary pattern by an electron beam pattern generator is easy. Therefore, reduction in inspection accuracy of an inspecting apparatus is unnecessary in a pattern inspection step.

Furthermore, in the Japanese Unexamined Patent Publication No. Hei 5-333524, an example in which the above mentioned auxiliary pattern method is applied to formation of a hole pattern.

However, in the case of the phase shift mask described in the publication, while in a condition of an illumination of a low coherence σ, an effect of large increase in depth of focus is achieved, there is a problem that such a effect of large increase in depth of focus cannot be obtained in a condition of annular illumination.

SUMMARY OF THE INVENTION

It is an object of the present invention to provide a photomask used for a projection exposure equipment, whose fabrication is easy by increasing a size of an auxiliary region, and with which transfer of the auxiliary pattern region can be decreased while an influence on a main pattern region is reduced and a large depth of focus can be achieved even in annular illumination condition.

A first photomask used for a projection exposure equipment according to the present invention comprises a transparent substrate and a light intercepting film provided on the transparent substrate. The transparent substrate comprises a main pattern region and an auxiliary pattern region provided in a periphery of the main pattern region. The auxiliary pattern region is etched to a depth at which a phase difference arises between light transmitted through the main pattern and light transmitted through the auxiliary pattern. The phase difference is of substantially an integral number of times as large as 360 degrees wherein the integral number is one selected from the group consisting of integral numbers of one or more and integral numbers of minus one or less. The light intercepting film comprises openings on the main pattern region and on the auxiliary pattern region.

Generally when a step portion is formed by etching in the transparent substrate, there arises a region in the vicinity of the step portion where a phase of light is drastically changed. Part of light whose phase is drastically changed has an effect to decrease in intensity of light on an image plane.

In the present invention, the effect to decrease in intensity of light in the step portion on an image plane is applied for prevention of an auxiliary pattern from transferring. That is, since an influence of the side wall of the step portion acts only in the vicinity thereof, exposure characteristics of the main pattern region is not greatly affected and only the transferring of the auxiliary pattern region is prevented from occurring. Therefore, sizes of the auxiliary pattern region and the main pattern region are substantially equal. Thus the fabrication is made easy.

Furthermore, since the auxiliary region is etched so that a phase difference arises at a value of an integral number of times as large as 360 degrees, even if the photomask is used in off-axis illumination condition, such as in annular condition or the like, a depth of focus can be increased.

A second photomask used for a projection exposure equipment according to the present invention comprises a transparent substrate and a semitransparent film provided on the transparent substrate. A phase difference of substantially 180 degrees is produced between light transmitted through the air and light transmitted through the semitransparent film. The transparent substrate comprises a main pattern region and an auxiliary pattern region provided in a periphery of the main pattern region. The auxiliary pattern region is etched to a depth at which a phase difference arises between light transmitted through the main pattern and light transmitted through the auxiliary pattern. The phase difference is of substantially an integral number of times as large as 360 degrees wherein the integral number is one selected from the group consisting of integral numbers of one or more and integral numbers of minus one or less. The semitransparent film comprises openings on the main pattern region and on the auxiliary pattern region.

The second photomask according to the present invention can increase a depth of focus when a mask of a half tone type is used in off-axis illumination condition, such as annular illumination, quadrupole illumination or the like. In the case of an isolated hole pattern, if exposure can be executed in an illumination condition of a low coherence σ, an effect of the photomask of a half tone type can sufficiently obtained, so that a depth of focus can be further increased.

However, actually, there sometimes is the case where a condition of a low coherence σ cannot be used and therefore, it is required to use off-axis illumination exposure, such as annular illumination or the like. The reason why is that lens distortion is changed if an illumination method is different.

That is, in an exposure step of a pattern of a line type such as a gate or the like or an isolation step in a fabrication process of a semiconductor device, annular illumination, which can increase a depth of focus, is used. For this reason, if an illumination optics is changed to a low coherence factor σ only when a contact hole is formed, there happens a case where superposition cannot be performed.

Since that a lens distortion is changed by switching illumination methods is because of production errors and orders of error are different on respective projection lenses, the change in distortion can sometimes reaches the maximum of 50 nm. As a result, accuracy in alignment of contact holes is deteriorated by a corresponding amount to the value.

Generally, since an alignment accuracy to be required in a contact hole is within 100 nm, only a switch of illumination methods covers more than a half of the value.

Therefore, in the second photomask of the present invention, a half tone phase shift mask is used and a depth of focus is increased when in use of off-axis illumination by providing an auxiliary pattern region of substantially the same size as a main pattern region. The auxiliary pattern region is etched to a depth corresponding to a phase difference of 360 degrees and transferring of the auxiliary pattern region is thus prevented from occurring by an influence of a side wall thereof.

A third photomask used for a projection exposure equipment according to the present invention comprises a transparent substrate and a light intercepting film provided on the transparent substrate. The transparent substrate comprises a main pattern region and an auxiliary pattern region provided in a periphery thereof. The auxiliary pattern region is etched to a depth at which a phase difference arises between light transmitted through the main pattern and light transmitted through the auxiliary region. The phase difference is substantially odd numbers of times as large as 180 degrees and a width of the auxiliary pattern is 0.7 times or more as large as that of the main pattern. The light intercepting film comprises openings on the main pattern region and on the auxiliary pattern region.

In the third photomask according to the present invention, in the case of a phase shift mask of an auxiliary pattern type, a size of an auxiliary pattern region is substantially the same as that of a main pattern region and thus a maximum effect of the auxiliary pattern region can be achieved. The auxiliary pattern region is fabricated by etching and transferring thereof is prevented from occurring by an influence of a side wall thereof.

The photomask of the present invention comprises an auxiliary pattern region of substantially the same size as that of the main pattern region, disposed in a periphery of the main pattern region. Therefore an effect of the auxiliary patter method can be realized to the maximum and the photomask has an effect to increase a depth of focus.

In the auxiliary pattern method, while as a size of an auxiliary pattern region is larger, a depth of focus in a main pattern region can be increased, the auxiliary pattern region of a size about half as large as that of the main pattern region has been used in a conventional technique for the purpose to prevent transferring of the auxiliary pattern region from occurring.

On the other hand, a photomask of the present invention is fabricated by etching an auxiliary region of a transparent substrate to a depth corresponding to a phase difference of, for example, 360 degrees and transferring of the auxiliary pattern is prevented from occurring by an influence of the side wall of an etched portion. Therefore, an auxiliary pattern region of substantially the same size as that of the main pattern region can be used. Since the side wall of the etched portion only gives an influence on light in the very close vicinity thereof, an transferred image of the main pattern region does not receive a much influence therefrom and transferring of the auxiliary pattern region is only prevented from occurring.

Since a photomask of the present invention has an auxiliary pattern region of substantially the same size as that of a main pattern region, it has another advantage that accuracy in mask production is improved. That is, a proximity effect can be corrected in drawing a mask patter region.

In drawing a mask by an electron-beam pattern generator, it is known that a size difference arises depending on a degree of fineness. On the other hand, since a photomask of the present invention has an auxiliary pattern region of substantially the same size as that of a main pattern region in an area of the outermost periphery of a repetition pattern or in area where a isolated pattern is located, drawing conditions of all the main patterns are the same and thereby production errors of a mask can be reduced by an amount corresponding to the proximity effect.

Besides, since a phase difference of 360 degrees occurs in light transmitted through a photomask, off-axis illumination, such as annular illumination is preferably used.

BRIEF DESCRIPTION OF THE DRAWINGS

FIG. 23 is a graph showing a relation between the phase difference and the new contrast NC in various defocus conditions.

DETAILED DESCRIPTION OF THE PREFERRED EMBODIMENTS

Figure 1A:
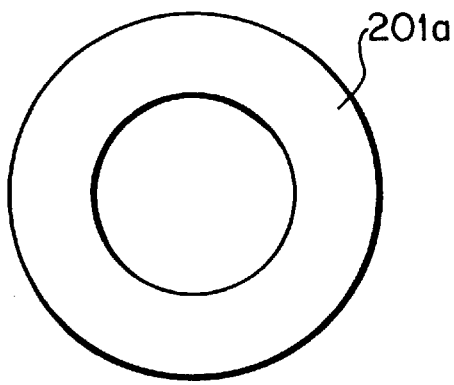
FIG. 1A is a typical view showing a diaphragm used in an ordinary illumination method which does not employ the off-axis illumination method.
Figure 1C:
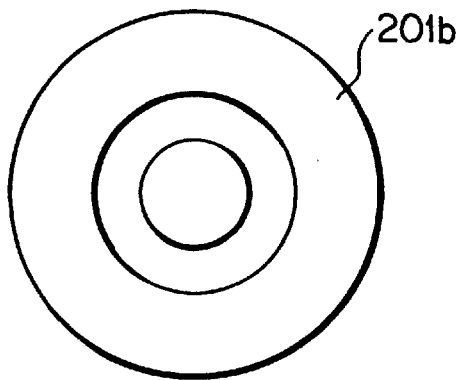
FIG. 1C is a typical view showing a diaphragm used in an illumination method employing the off-axis illumination method.
Figure 1B:
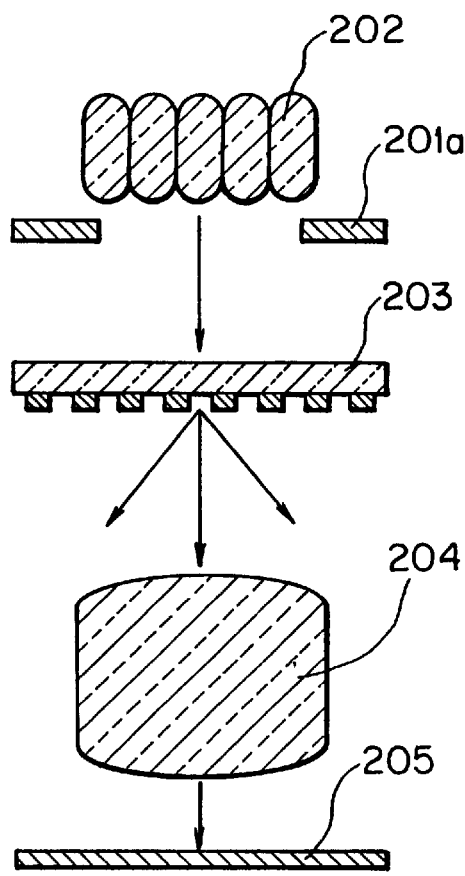
FIG. 1B is a typical view showing a main optical system of the exposure equipment as same as FIG. 1A.
Figure 1D:
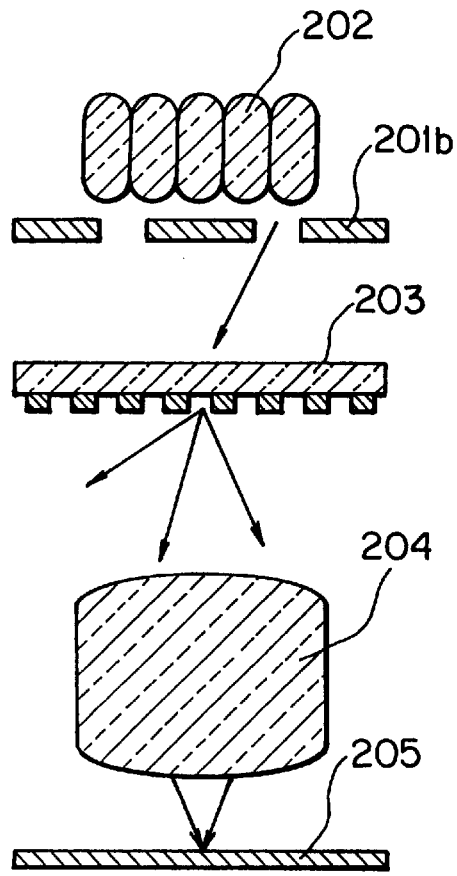
FIG. 1D is a typical view showing a main optical system of the exposure equipment as same as FIG. 1C.
Figure 2A:
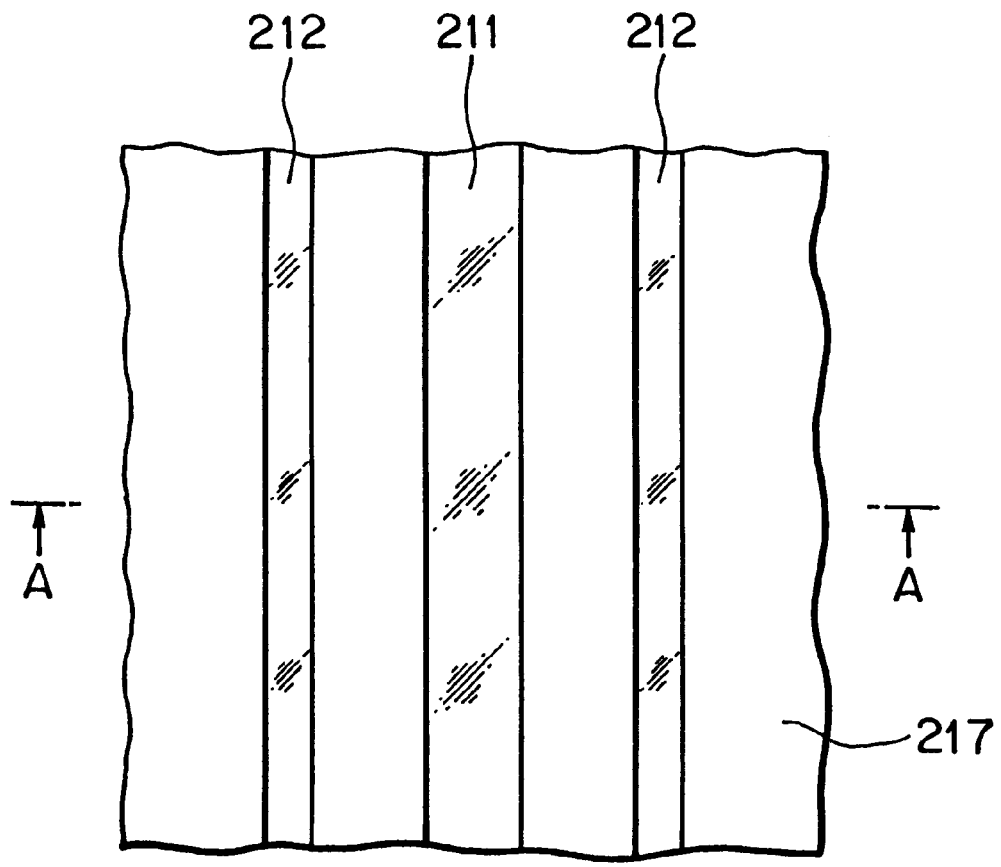
FIG. 2A is a plan view showing a structure of a conventional auxiliary pattern region and FIG. 2B is a sectional view taken on line A—A of FIG. 2A.
Figure 2B:
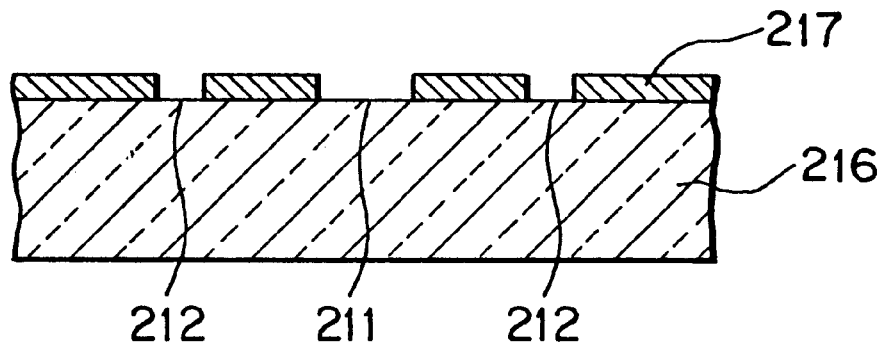
Figure 3A:
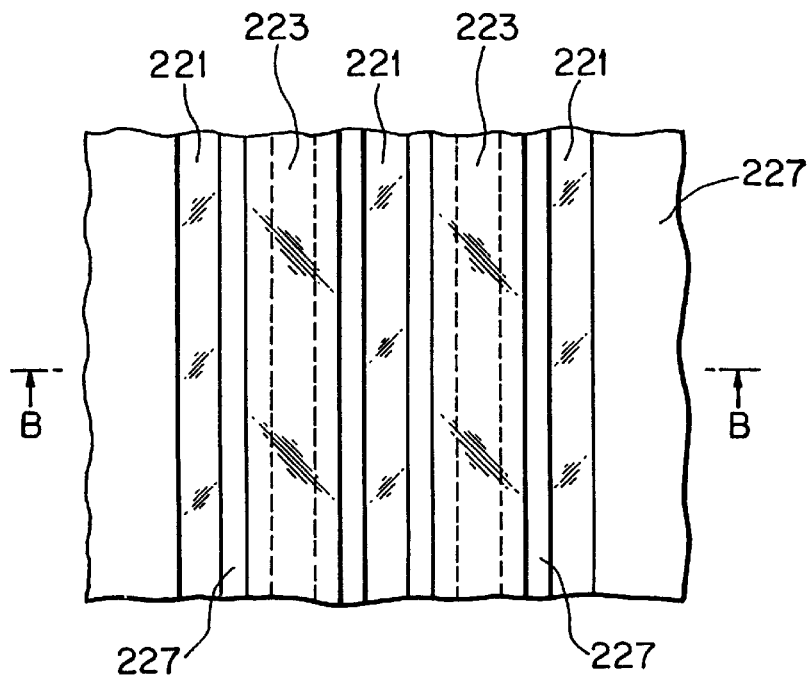
FIG. 3A is a plan view showing a structure of a Shibuya-Levenson phase shift mask.
Figure 3B:
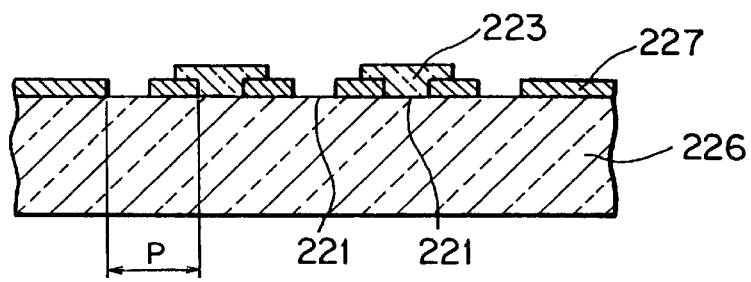
FIG. 3B is a sectional view taken on line B—B of FIG. 3A
Figure 3C:
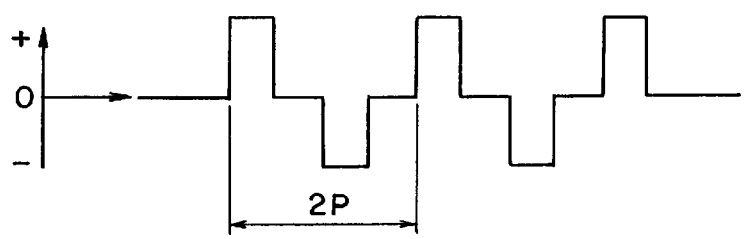
FIG. 3C is a typical diagram showing a amplitude distribution of transmitted light of the phase shift mask.
Figure 4:
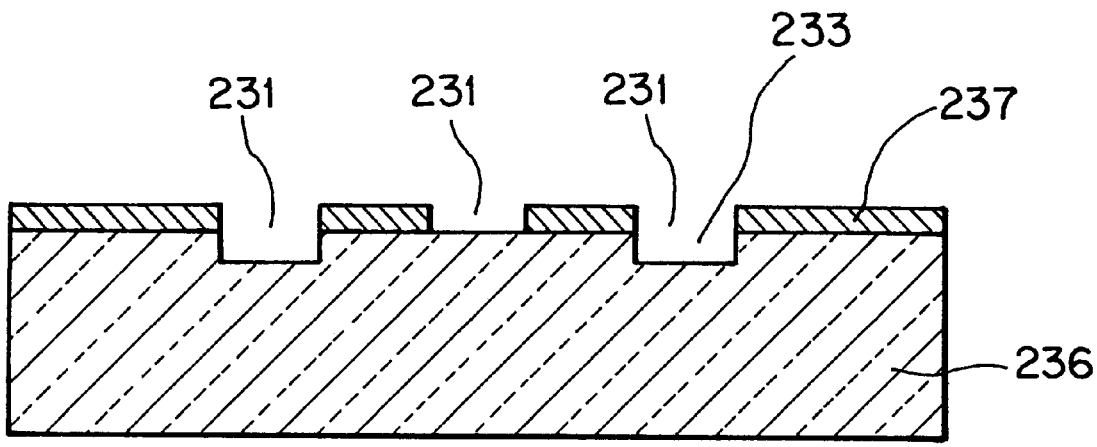
FIG. 4 is a sectional view showing a structure of a conventional phase shift mask described in Japanese Unexamined Patent Publication (Kokai) No. Hei 7-77796.
Figure 5:
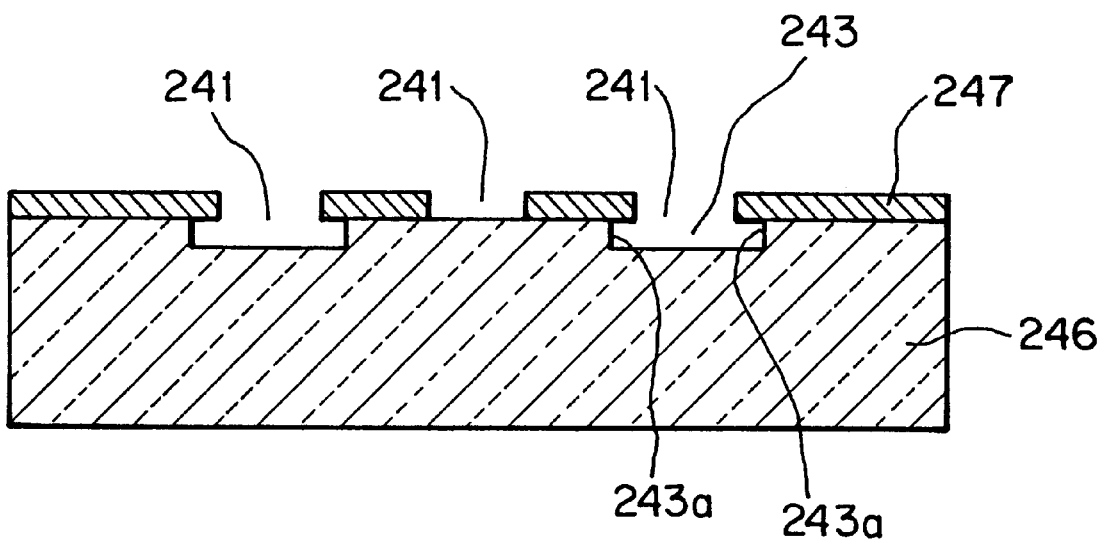
FIG. 5 is a sectional view showing a structure of a conventional phase shift mask described in Japanese Unexamined Patent Publication (Kokai) No. Hei 8-194303.
Figure 6A:
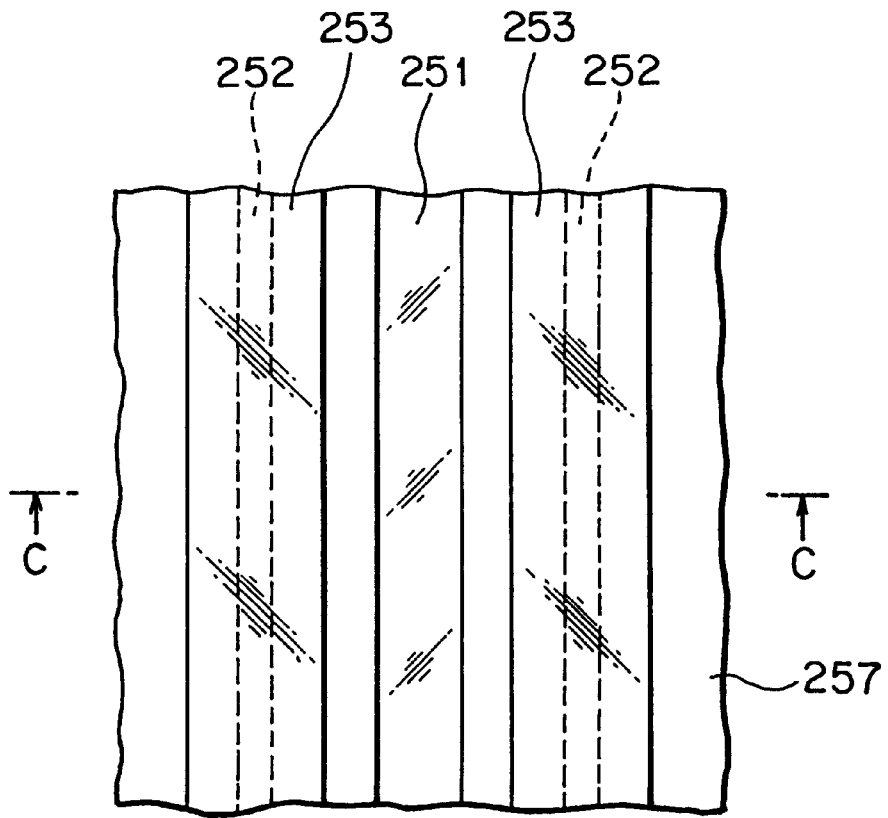
FIG. 6A is a plan view showing a structure of a conventional auxiliary pattern type phase shift mask and FIG. 6B is a sectional view taken on line C—C of FIG. 6A.
Figure 6B:
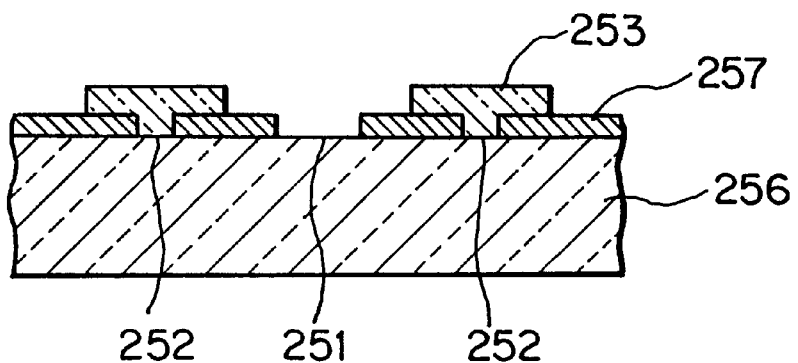
Figure 7A:
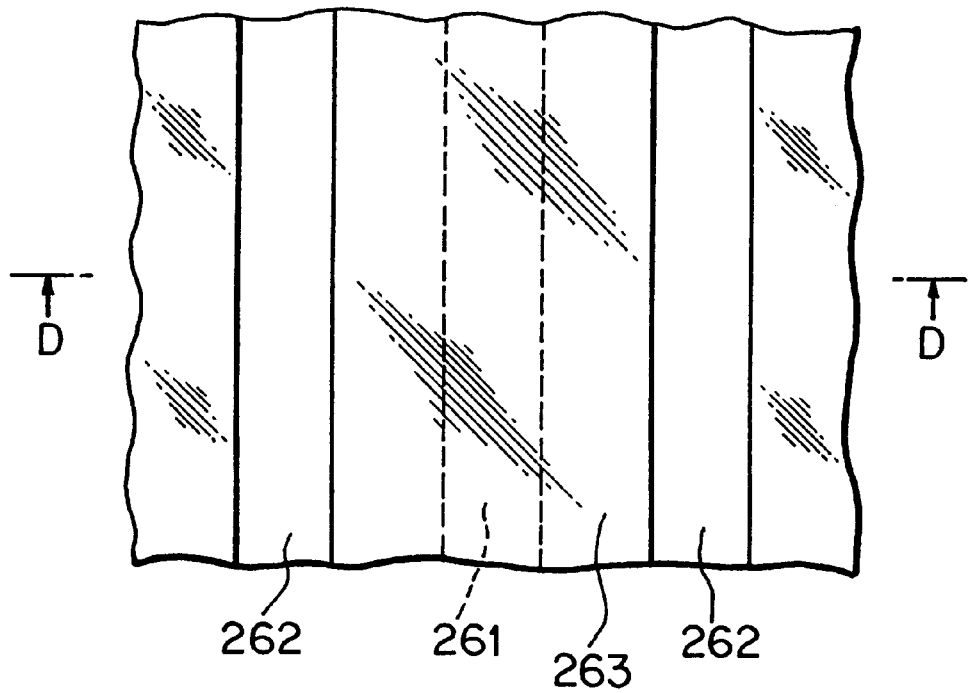
FIG. 7A is a plan view showing a structure of a phase shift mask described in Japanese Unexamined Patent Publication (Kokai) No. Hei 5-333524
Figure 7B:
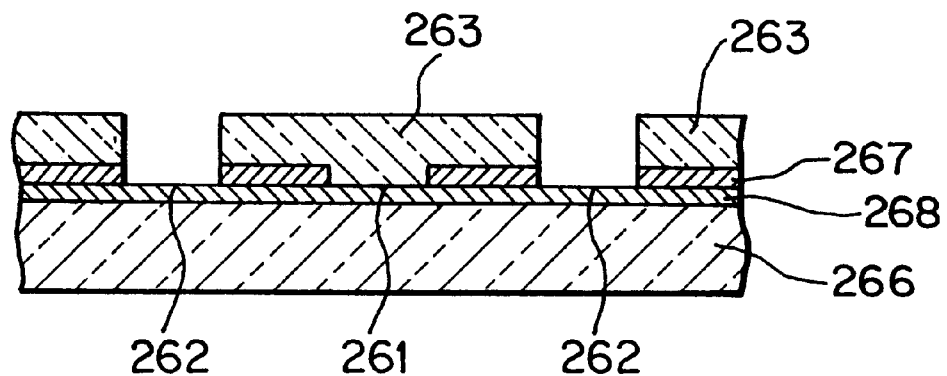
FIG. 7B is a sectional view taken on line D—D of FIG. 7A.
Figure 8A:
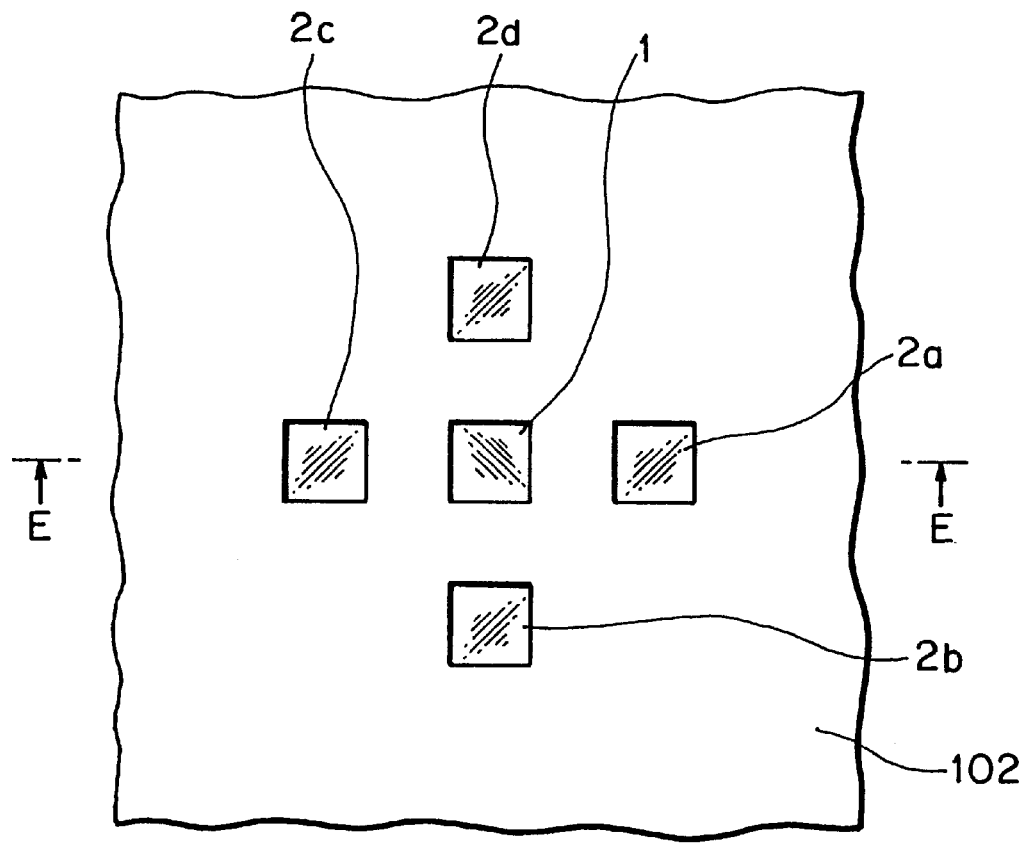
FIG. 8A is a plan view showing a structure of a photomask according to a first embodiment of the present invention and FIG. 8B is a sectional view taken on line E—E of FIG. 8A.
Figure 8B:
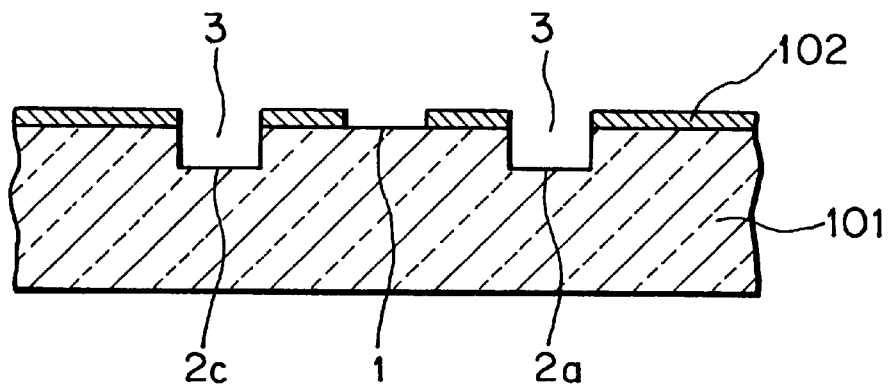

Embodiments of the present invention will in a concrete manner be given in reference to the accompanying drawings below. FIG. 8A is a plan view showing a structure of a photomask according to a first embodiment of the present invention and FIG. 8B is a sectional view taken on line E—E of FIG. 8A. The first embodiment is a photomask which is used for a KrF excimer laser exposure equipment with annular illumination in which a ratio between pattern sizes of a mask pattern and an image plane, that is a reducing magnification, is ⅕, a numerical aperture NA is 0.55 and a light interception ratio is 50%. That the light interception ratio is 50% shows that the maximum coherence factor is 0.8 and a coherence factor in the central portion is 0.4.

A photomask according to the first embodiment has a light intercepting film 102 made of chromium as a main component on a transparent substrate 101 made of synthetic quartz, as shown in FIGS. 8A and 8B. A main pattern region 1 of 0.9 μm square is divided on the transparent substrate 101. With this, an isolated hole pattern of 0.18 μm square is to be formed on an image plane.

Hole pattern regions each of 0.9 μm square whose sides are made of four sides parallel to the respective sides of the main pattern region 1 are partitioned as auxiliary pattern regions 2a, 2b, 2c or 2d, wherein the auxiliary pattern regions 2a, 2b, 2c and 2d are respectively opposed to the four sides of the main pattern region 1. Distances between the respective auxiliary pattern regions 2a, 2b, 2c or 2d and the main pattern region 1 are 0.9 μm. Openings are formed at positions in alignment with the main pattern region 1 or the auxiliary pattern regions 2a, 2b, 2c or 2d in the light intercepting film 102. As shown in FIG. 8B, the auxiliary pattern regions 2a, 2b, 2c and 2d of the transparent substrate 101 each are etched to a depth of, for example, 496 nm to form an etching step portion 3. Since a refractive index of the transparent substrate 101 made of synthetic quartz is 1.5 and a etched depth is 496 nm, a phase difference of 360 degrees arises between light transmitted through any of the auxiliary patter regions 2a, 2b, 2c and 2d and light transmitted through the main pattern 1 in the case where excimer laser light of a wavelength of 248 nm is used.

In general when a step portion is formed on a transparent substrate, there arises an region in the vicinity of the step portion in which a phase of light is dramatically changed. The light from the region where the phase is dramatically changed has an effect to decrease light intensity on an image plane.

For this reason, as described above, a method, in which an influence from a side wall is reduced, has been studied in order to decrease a size difference between adjacent patterns in the case of a conventional Shibuya-Levenson type photomask. For example, there is provided a method in which the side wall is made to retreat to under the light intercepting film.

On the other hand, the effect to reduce light intensity in the etching step portion 3 is applied to prevent transferring of an auxiliary pattern from occurring in the case of a photomask according to the first embodiment of the present invention constructed as mentioned above. That is, since an influence of the side wall of an etching step portion 3 acts to a region in the vicinity thereof, no much influence is given to exposure characteristics of the main pattern region and only transferring of an auxiliary pattern region is prevented from occurring.

Figure 9:
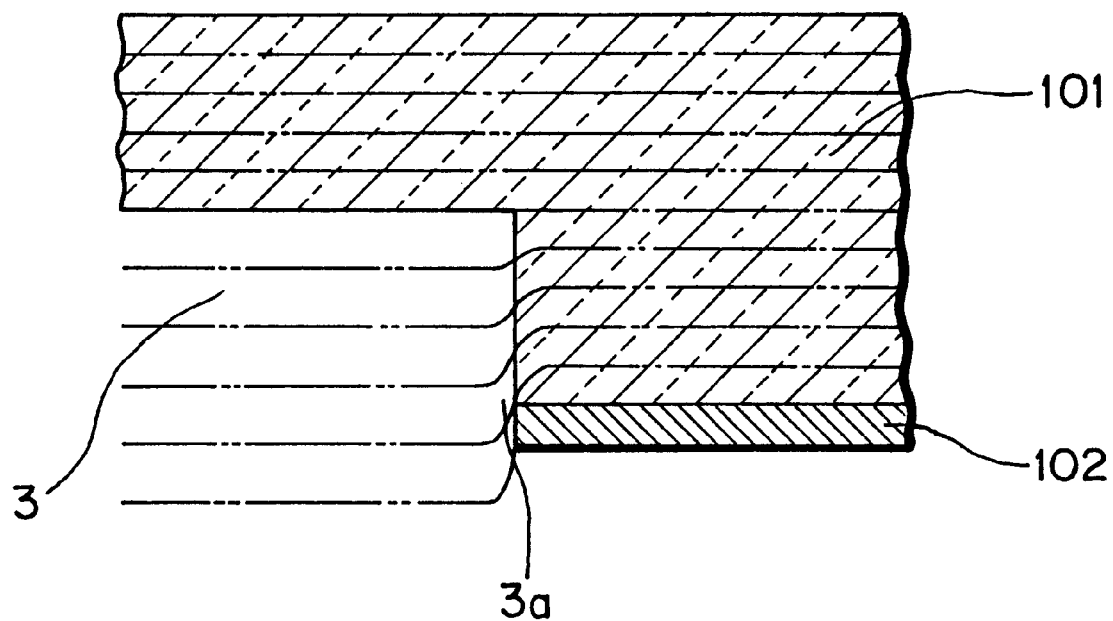
FIG. 9 is a typical view showing a phase of light at a etching step portion.

FIG. 9 is a typical view showing a phase of light in a etching step portion. Two-dot chain lines show planes of the same phase of light transmitted in FIG. 9. As shown in FIG. 9, in the vicinity of the side wall of the etching step portion 3, projection and reflection of light occur and thereby there arises a region 3a where a phase is in disorder, that is the phase difference is other than of zero degree or 360 degrees.

In such a manner, in the embodiment, light from the region 3a where a phase is in disorder in the outer periphery of an auxiliary pattern region causes an interference with light whose phase is changed by 360 degrees from another auxiliary pattern region and thereby the light intensity of the light of the phase change of 360 degrees is reduced. Therefore, transferring the auxiliary pattern regions 2a, 2b, 2c and 2d is prevented from occurring.

In order to prevent simply transferring the auxiliary pattern regions 2a, 2b, 2c and 2d, a depth of the etching step portions 3 thereof may properly be set. On the other hand, in the embodiment, the depth of the etching step portion 3 is set so that a phase difference of 360 degrees may occur in consideration of the relation between a phase difference and an exposure characteristics. Therefore, with use under off-axis illumination, such as annular illumination or the like, the depth of focus is increased. Moreover, if the phase difference is a value of an integral number of times of 360 degrees except for zero degree, a similar effect can be achieved.

As mentioned above, in an auxiliary pattern method, as a size of the auxiliary pattern region is larger, an effect to improve a depth of focus in the main pattern region is larger. Therefore, in the present invention, since auxiliary pattern regions 2a, 2b, 2c and 2d of about the same size as that of a main pattern region 1 are formed, the depth of focus of the main pattern region 1 can be increased.

Figure 10:
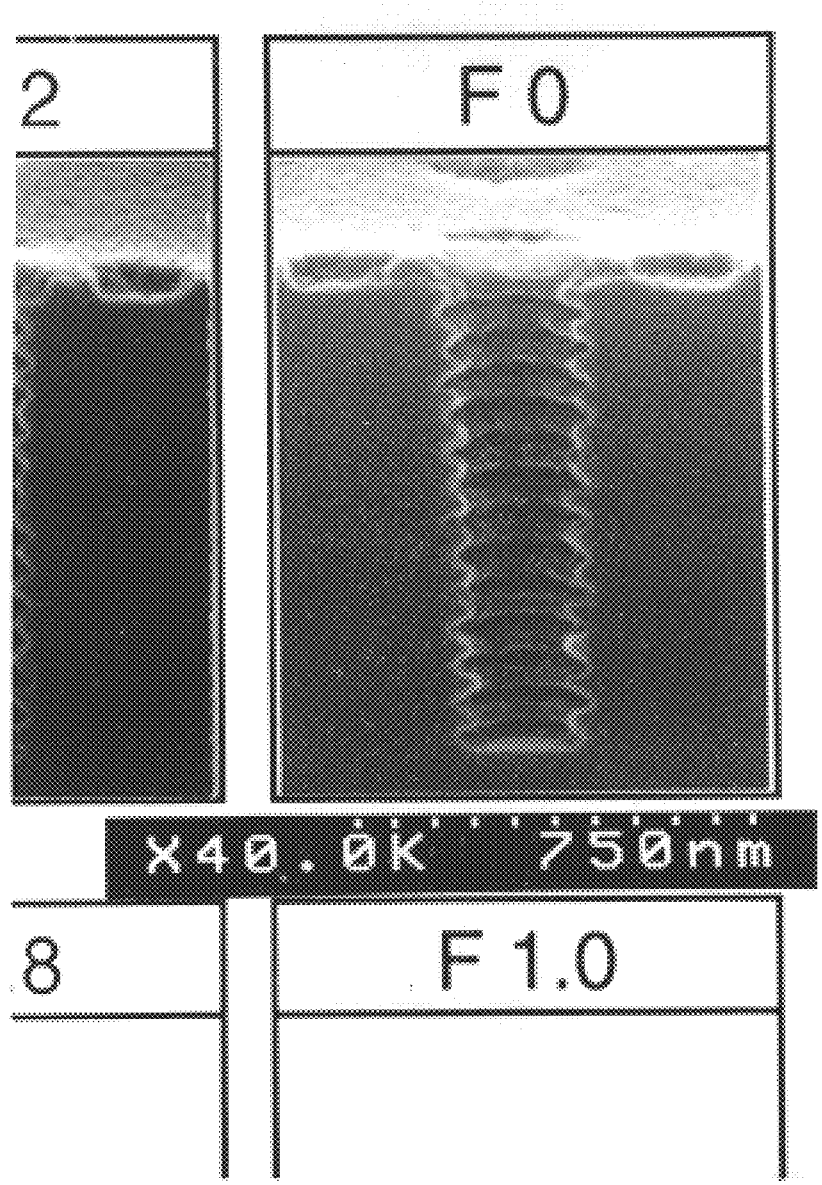
FIG. 10 is a SEM photograph showing a pattern transferred to photosensitive resin with use of a photomask according to the first embodiment.

FIG. 10 is a SEM photograph showing a pattern transferred to photosensitive resin with use of a photomask according to the first embodiment. As can be seen from FIG. 10, while an isolated hole pattern with a high accuracy is formed in photosensitive resin, auxiliary pattern regions of the same size as that of the main pattern region 1 is not resolved in the resin. This is an influence of the side wall of an etching step portion 3.

Figure 11:
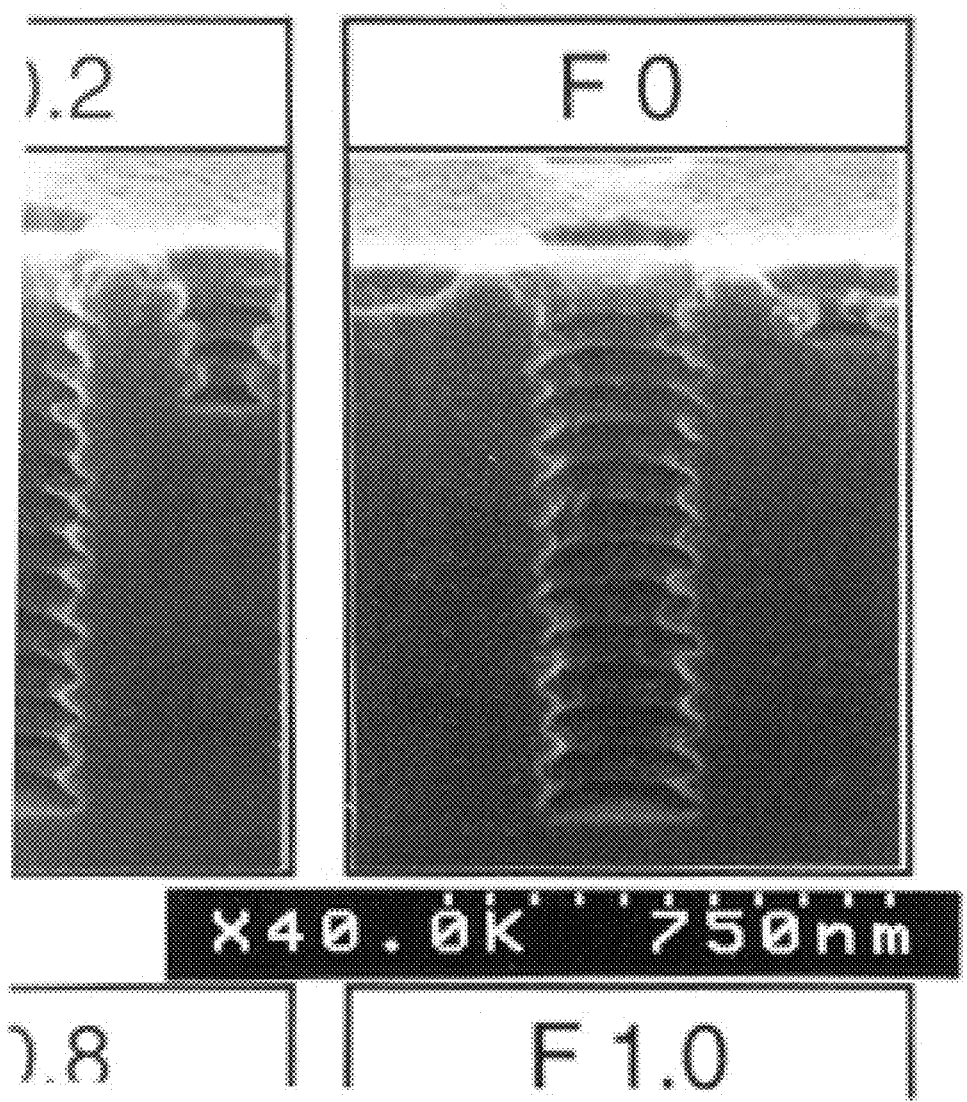
FIG. 11 is a SEM photograph showing a pattern transferred to photosensitive resin with use of a photomask for a hole pattern of 0.2 μm square.

A photomask for formation of a hole pattern of 0.2 μm square will be described. When exposure is performed by a projection equipment used in the embodiment with use of a photomask having a main pattern region 1 of 1.0 μm square and auxiliary pattern regions of 1.0 μm square, formed at positions spaced from the main pattern region 1 each by 1.0 μm in order to form a hole pattern of 0.2 μm square, the auxiliary pattern regions are sometimes transferred partly. FIG. 11 is a SEM photograph showing a pattern transferred to photosensitive resin with use of a photomask for a hole pattern of 0.2 μm square. While when the above mentioned hole pattern of 0.18 μm square is formed, the auxiliary pattern regions are not transferred, in the case of a pattern of 0.2 μm square some of auxiliary pattern regions is transferred as shown in FIG. 11. It is considered that the reason why is that energy or intensity of light to be transmitted through the hole pattern region is proportional to the area of a pattern region, while an effect for a side wall of an etching step portion to reduce light intensity is proportional to the length of a side of the pattern region, and an influence of the side wall of an etching step portion is relatively smaller as a pattern region is larger.

In the exposure conditions, the upper limit of the same size at which a main pattern region and auxiliary pattern regions can be designed is 0.2 μm. In the case where a main pattern region adopts a size larger than this value, a size of each of auxiliary pattern regions is still required to be set 0.2 μm, since if not, the auxiliary pattern regions are transferred.

If exposure conditions are changed, an influence of the side wall of an etching step portion is changed and therefore an upper limit applicable to auxiliary pattern regions is required to be checked in each exposure condition. Generally, if an upper limit of auxiliary pattern regions is set on the order of 0.7 to 1 times of that of a main pattern region, a size of the auxiliary pattern regions can be determined at a level at which they are not transferred.

The present invention is not limited to a photomask for an isolated hole pattern, but also applicable to photomasks, for example, a lines and spaces pattern and the like.

Figure 12A:
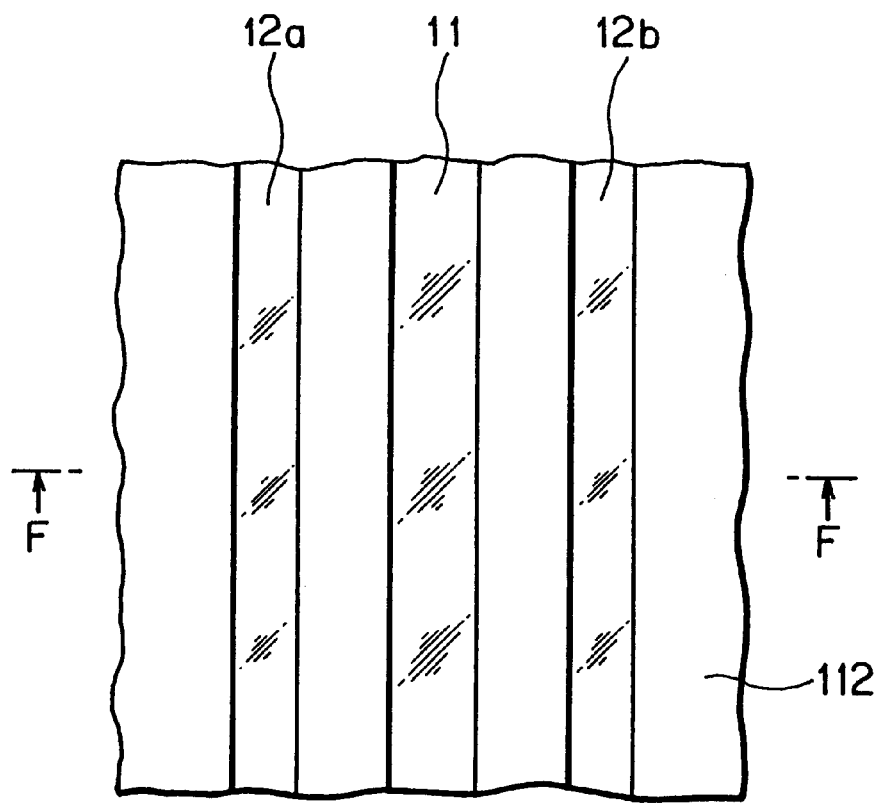
FIG. 12A is a plan view showing a structure of a photomask according to a second embodiment of the present invention and FIG. 12B is a sectional view taken on line F—F of FIG. 12A.
Figure 12B:
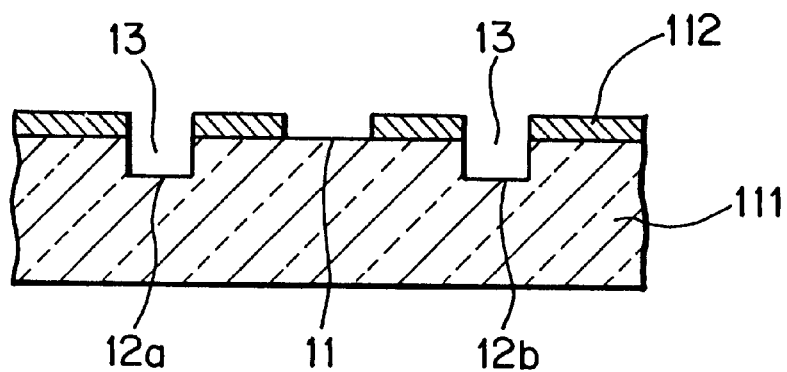

FIG. 12A is a plan view showing a structure of a photomask according to a second embodiment of the present invention and FIG. 12B is a sectional view taken on line F—F of FIG. 12A. In the second embodiment, a light intercepting film 112 made of chromium as a main component formed on a transparent substrate 111 made of synthetic quartz. A main pattern region 11 having a line like shape is divided on the transparent substrate 111. Auxiliary patterns 12a and 12b extending along the same direction as that of the main pattern region 11 are divided on the sides, left and right, thereof as viewed. Since the auxiliary pattern regions in the case of a lines and spaces pattern is easier to be resolved than the case of a hole space, a width of each of the auxiliary pattern regions is required to be formed somewhat smaller than that of the main pattern region. The reason why is that, while in the case of a hole pattern influences of the side wall of an etching step portion formed in auxiliary regions come from the four points, in the case of a lines and spaces pattern influences of the side wall come from two points only. When a size of a main pattern region is 1 μm, a size of an auxiliary pattern region is, for example, 0.9 μm.

In the embodiment, as shown in FIG. 12B, auxiliary pattern regions 12a and 12b in the transparent substrate 111 each are etched to a depth of 496 nm to form etching step portions 13.

Even in the second embodiment constructed in such a manner, there arises a phase difference of 360 degrees between light transmitted through the auxiliary pattern regions 12a or 12b and light transmitted through the main pattern region 11. In the case of a space pattern of 1 μm the maximum size of an auxiliary pattern region was 0.9 μm. When 0.9 μm was adopted as a size of an auxiliary pattern region, transferring of the auxiliary pattern region occurred at the same level as that in the case where an auxiliary pattern region of 0.6 μm was provided in a conventional fine auxiliary pattern method.

Figure 13:
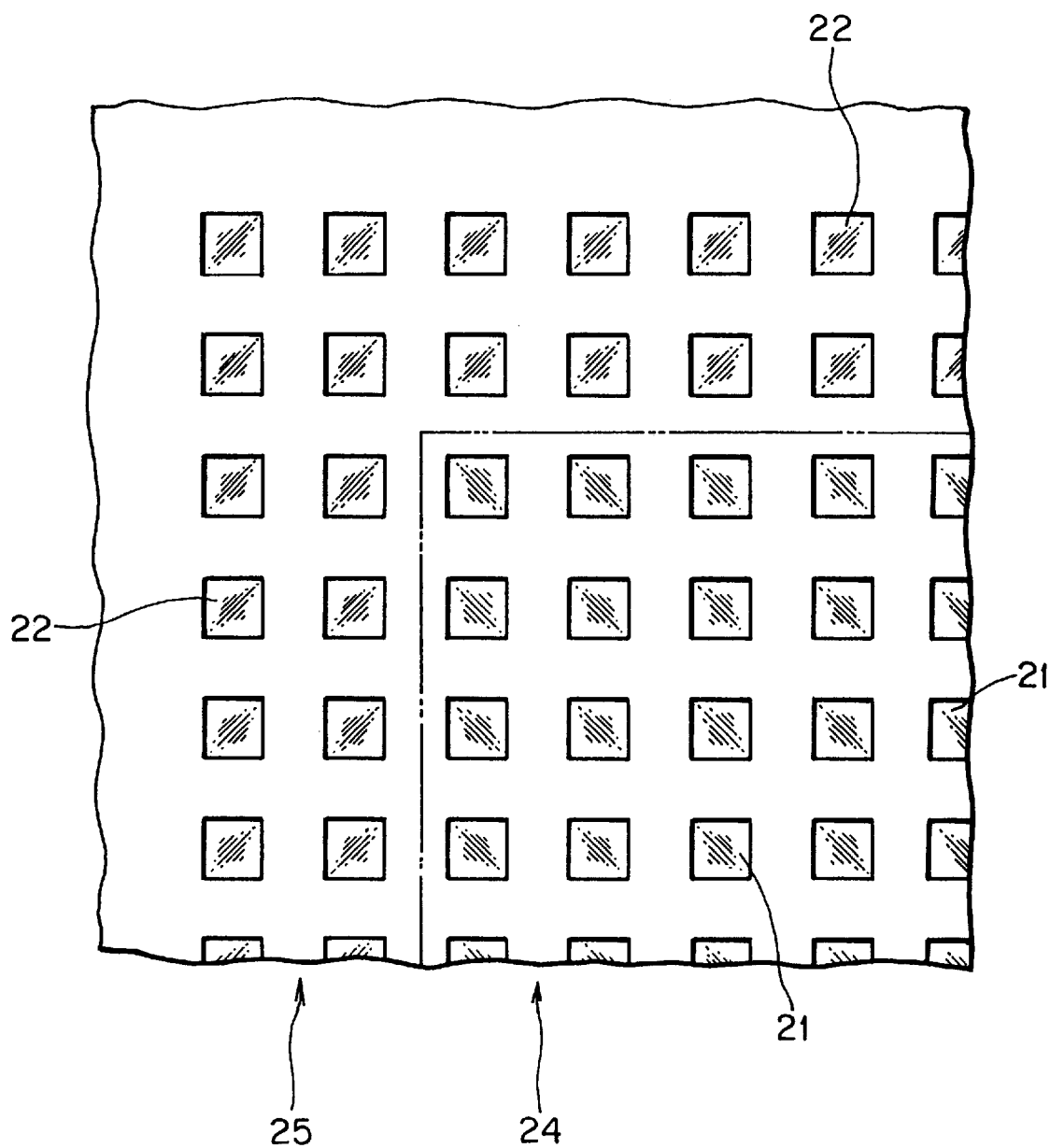
FIG. 13 is a plan view showing a structure of photomask according to a third embodiment of the present invention.

A main pattern region may be a repetition pattern, wherein the pattern is not a perfectly isolated pattern. FIG. 13 is a plan view showing a structure of photomask according to a third embodiment of the present invention. In the embodiment, plural main pattern regions 21 are arranged in a grid like shape at constant distance between adjacent patterns and a main pattern region group 24 comprises these plural main pattern regions 21. Plural auxiliary pattern regions 22 of the same size as that of a main pattern regions 21 are divided at constant distances in the outer periphery of the main pattern region group 24. An auxiliary pattern region group 25 comprises plural auxiliary pattern regions 22. A transparent substrate is etched to a depth corresponding to a phase difference of 360 degrees in each of the auxiliary pattern regions 22.

Generally in the case of a periodic pattern, an effect to improve a depth of focus by off-axis illumination is low in the outermost peripheral pattern region and the outermost pattern region is not resolved at a value of a depth of focus as it is changed. However, in the third embodiment, since the auxiliary pattern regions 22 are disposed in the outer periphery, a depth of focus is globally made larger.

Figure 14:
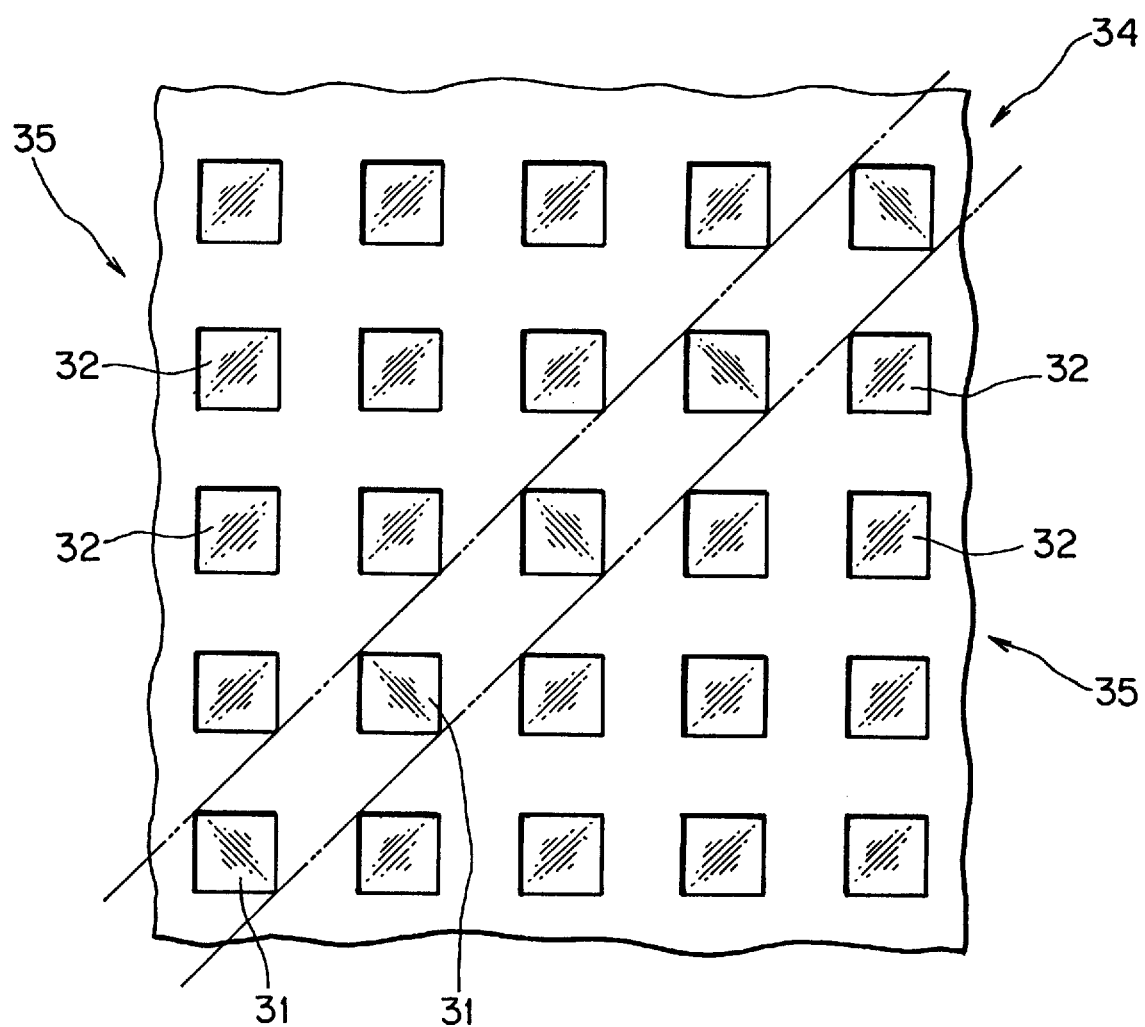
FIG. 14 is a plan view showing a structure of photomask according to a fourth embodiment of the present invention.

Main patterns may be arranged with a periodicity in one direction. FIG. 14 is a plan view showing a structure of photomask according to a fourth embodiment of the present invention. In the embodiment, plural main pattern regions 31 are periodically divided along one direction and a main pattern region group 34 comprises the plural main pattern regions 31. Plural auxiliary pattern regions 32 are disposed at constant distances in the outer periphery of the main pattern region group 34. An auxiliary pattern region group 35 comprises plural pattern regions 32. A transparent substrate is etched to a depth corresponding to a phase difference of 360 degrees in each of the auxiliary pattern regions 32.

Generally in the case where plural main pattern regions are partitioned along one direction periodically, but not along another direction with no periodicity, an effect of off-axis illumination is low and a depth of focus is also shallow. On the other hand, in the embodiment, an auxiliary pattern region group 35 is divided in the outer periphery of a main pattern region group 34 and a pattern structure with a multidirectional periodicity is adopted, so that a depth of focus is made increased.

As described above, only if transferring of an auxiliary pattern region is desired to be prevented, there comes no problem as far as an etching step portion in the auxiliary region is formed so as to produce a phase difference equal to or more than 180 degrees.

However, in order to improve a depth of focus with use of off-axis illumination method, it is desired that a phase difference is a value of any multiples of 360 degrees, such as 360, 720, 1080 or the like. The reason why is that resolution characteristics of a main pattern region are changed according to a phase difference with an auxiliary pattern region.

A relation between the defocus and the light intensity distribution will be described. FIGS. 15A to 15F are graphs showing relations between the defocus and the light intensity distribution in various phase differences, wherein positions on an image plane are plotted on the axis of abscissa and values of relative light intensity are plotted on the axis of ordinate. In FIGS. 15A to 15F, a solid line indicates the best focus and a broken line indicates a defocus of −0.5 μm and a dotted line indicates a defocus of +0.5 μm. The relations shown in FIGS. 15A to 15F are obtained in simulation by use of a lithography simulator on the market Porlith/2 made by FINLE Technologies, Inc. on a photomask comprising a hole pattern region of 1 μm and auxiliary patterns disposed in the outer periphery of the hole pattern region. Simulation conditions are wavelength λ of 248 nm, a numerical aperture NA of 0.55, and 50% annular (σ=0.4–0.8).

While in this simulation, since an influence of the side wall of an etching step portion on a transparent substrate is outside consideration, an intensity of an auxiliary pattern region is emphasized, the light intensity is actually reduced to a level at which the auxiliary pattern region is not transferred by an influence of the side wall. At present, a simulation in which a three dimensional structure is within consideration has not yet developed, while a simulation is two-dimensionally available and therefore a transferred image of a photomask according the present invention has not yet been simulated in a correct manner.

Figure 15A:
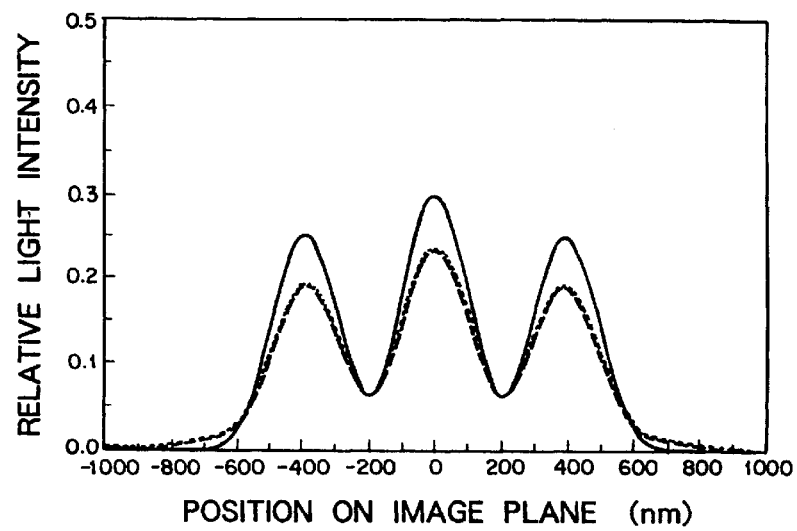
FIGS. 15A to 15F are graphs showing relations between the defocus and the light intensity distribution in various phase differences.
Figure 15B:
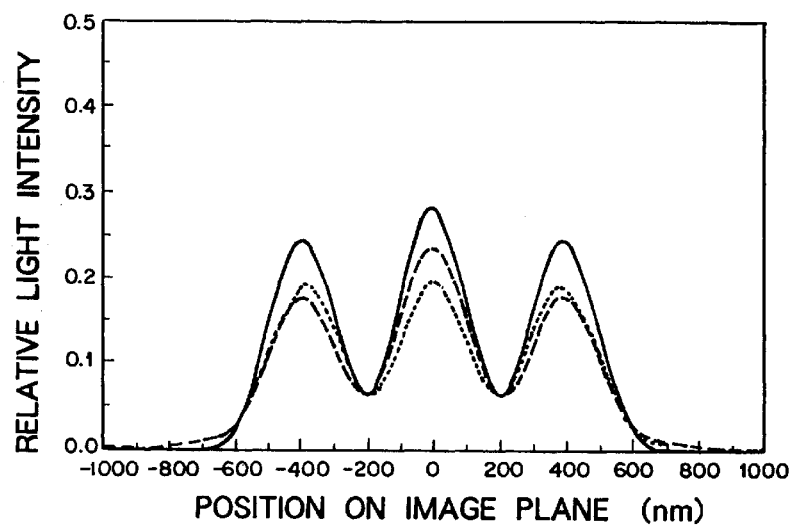
Figure 15C:
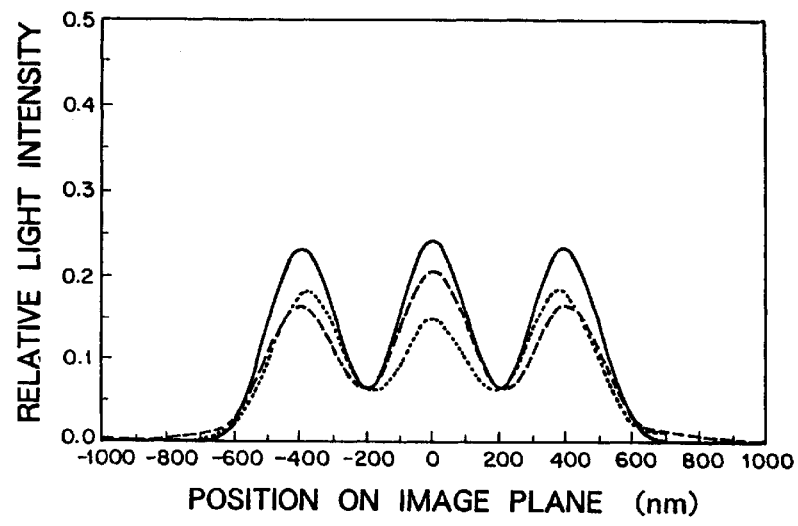
Figure 15D:
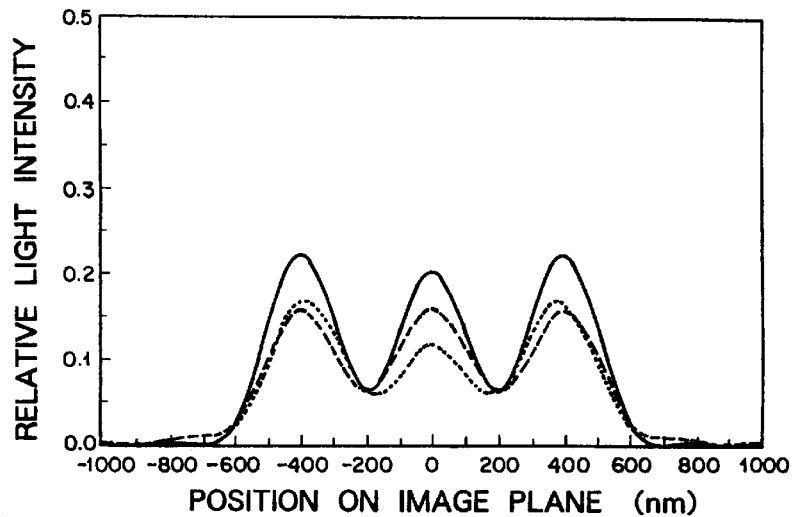
Figure 15E:
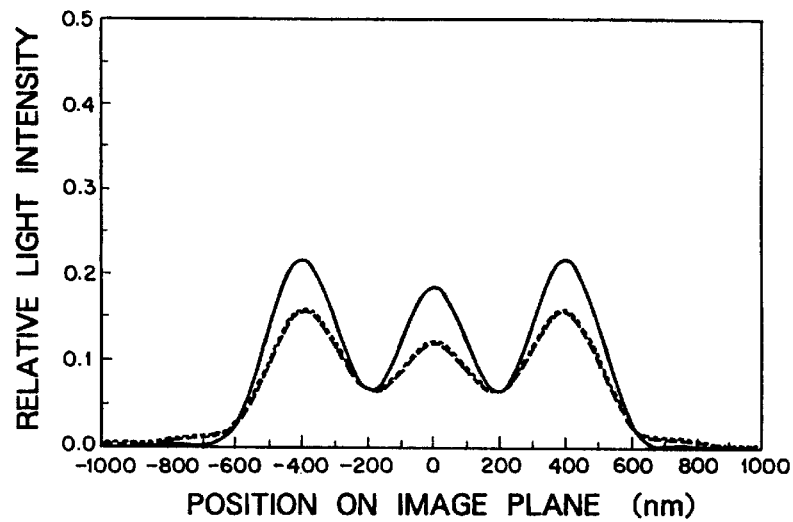
Figure 15F:
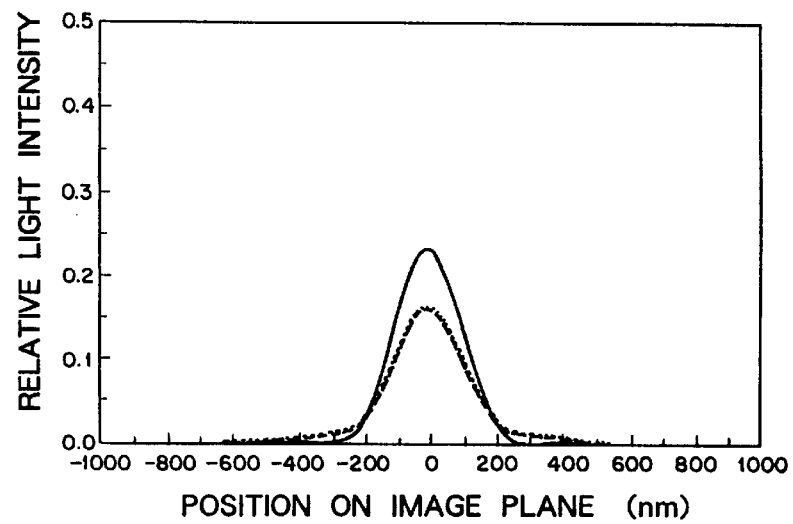

FIGS. 15A to 15E respectively show relations in the cases of phase differences of zero, 45, 90, 135 and 180 in that order and FIG. 15F shows a comparative example where no auxiliary pattern regions are provided.

In the case of a photomask shown in FIG. 15F where no auxiliary pattern regions are provided, similar light intensity distributions are obtained for each of +/− defocuses.

On the other hand, in the case where phase differences shown in FIGS. 15B, 15C or 15D respectively are 45, 90 and 135 degrees of phase differences, light intensity distributions are different according to +/− signs of the defocus. In these cases, since a size change of a pattern by a defocus is larger, it is desired that a phase difference is a value of an integral number of times of 180 degrees from a view point of a pattern size control. As shown in FIGS. 15A and 15E, when light intensities are compared with each other between phase differences of 0 degree and 180 degrees, the case of a phase difference of 0 degree shown in FIG. 15A has a steeper image.

Figure 16:
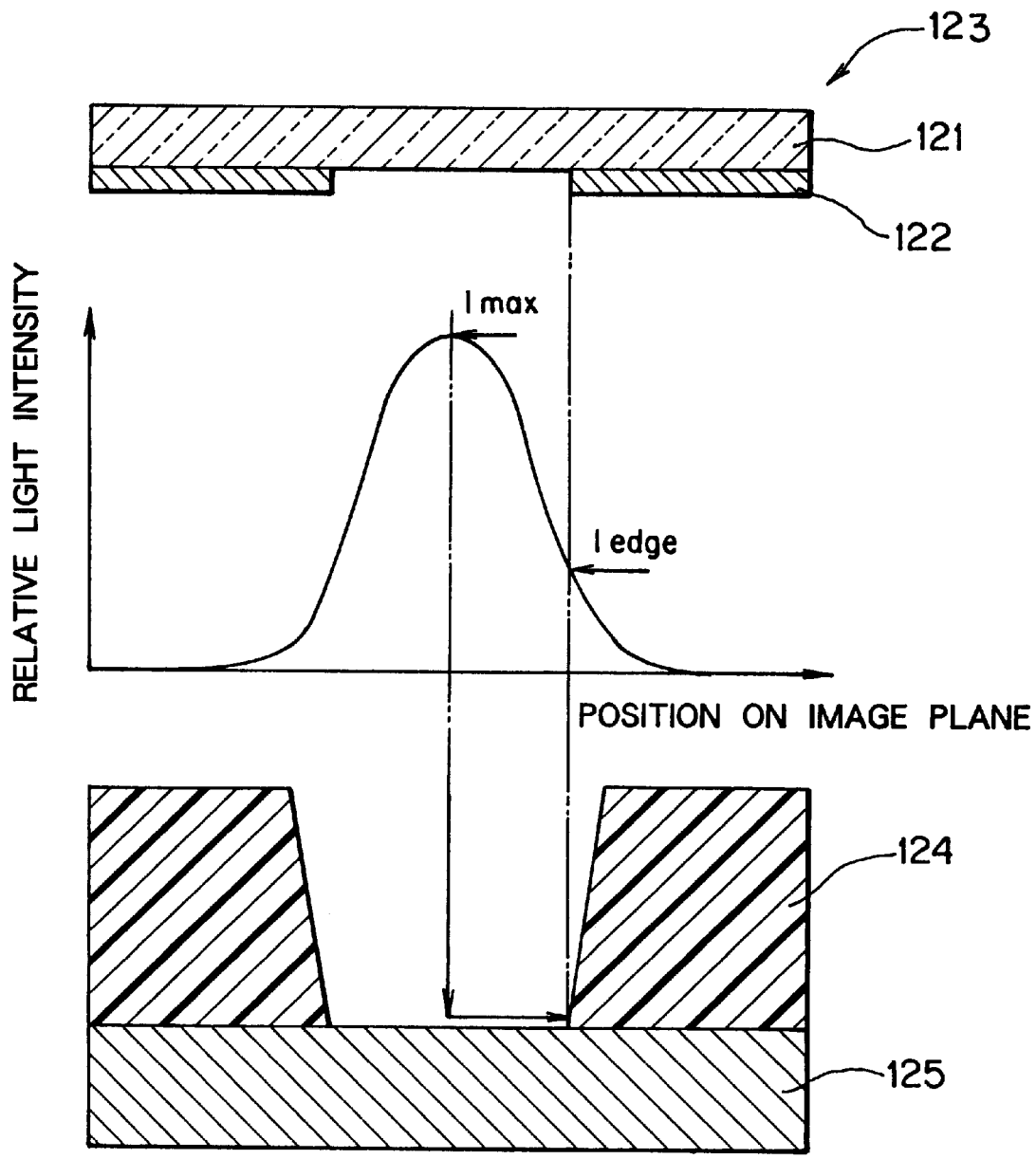
FIG. 16 is representation illustrating $I_{max}$ and $I_{edge}$.

A quality of a transferred image of a main pattern region is evaluated by a new contrast NC defined by the following mathematical formula (3), which is:

$$NC = I_{max}/I_{edge} \quad (3)$$

where $I_{max}$ indicates the maximum light intensity and $I_{edge}$ indicates a light intensity at a pattern edge at the best focus. FIG. 16 is representation illustrating $I_{max}$ and $I_{edge}$ and shows relations among a photomask, a light intensity distribution of light transmitted through the photomask and a pattern formed on photosensitive resin by transmitted light. When a photomask 123 comprising a transparent substrate 121 and a light intercepting film 122 formed thereon as shown in FIG. 16, transmitted light through the photomask 123 shows a relative intensity distribution like a normal distribution. The maximum light intensity $I_{max}$ is to show the maximum of the relative light intensity. The light intensity $I_{edge}$ at a pattern edge at the best focus is to show a light intensity at the boundary between the light intercepting film and the transparent region of the photomask 123.

To adjust a light intensity $I_{edge}$ at a pattern edge at the best focus is corresponds to setting an exposure dose so that a pattern size of photosensitive resin 124 formed on a semiconductor substrate 125 at the best focus may be a target value.

While an pattern forming process, such as an exposure step, a developing step and the like of the photosensitive resin 124, is actually complex, the process can, in a simplified manner, be considered to proceed in such a manner that development is vertically advanced from a point where a light intensity shows its maximum till the development reaches the bottom portion and thereafter the development is turned along a horizontal direction, so that photosensitive resin 124 is processed to form an opening of a predetermined size.

For this reason, an assumption is possible that if $I_{max}$ is larger than a value, the photosensitive resin 124 can be developed down to the bottom portion so as to form a pattern. Therefore, it is considered that when an exposure dose is set with $I_{edge}$ of a value as reference at which an target size can be achieved, photosensitive resin 124 can be developed to the target size if a new contrast NC is equal to or larger than a value.

A value of the new contrast NC at which pattern formation is possible in photosensitive resin 124 is dependent on a performance of the photosensitive resin 124 and as a resolving power is higher, a pattern can formed with a lower new contrast NC. Generally, the limit is in the range of 1.4 to 1.6.

Figure 17:
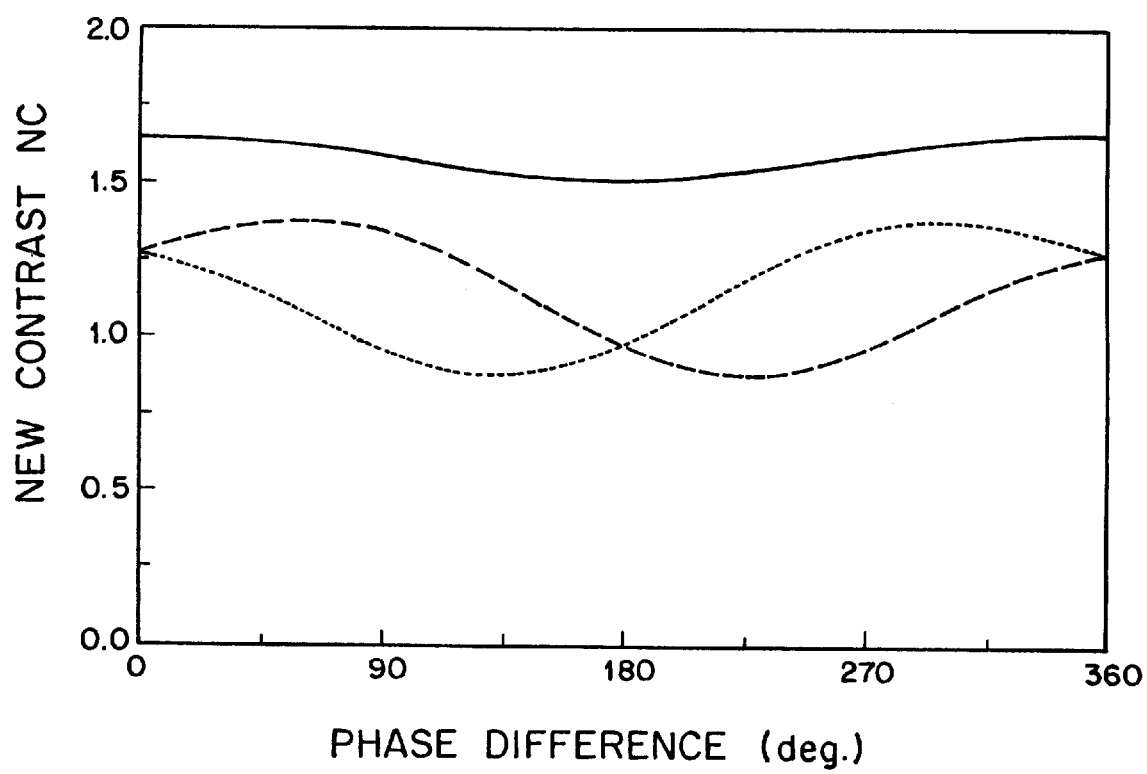
FIG. 17 is a graph showing a relation between the phase difference and the new contrast NC in various defocus conditions.

A relation between the new contrast NC and the phase difference will be described. FIG. 17 is a graph showing a relation between the phase difference and the new contrast NC in various defocus conditions, wherein values of the phase difference between light transmitted through a main pattern and light transmitted through an auxiliary pattern are plotted on the axis of abscissa and values of the new contrast are plotted on the axis of ordinate. In FIG. 17, a solid line indicates the best focus and a broken line indicates a defocus of −0.5 μm and a dotted line indicates a defocus of +0.5 μm. As shown in FIG. 17, a new contrast NC at the best focus in the case where a defocus is 0 μm is conspicuously higher than those in the cases where a defocus is +0.5 or −0.5 μm. In the best focus condition, a new contrast NC assumes the highest value at a phase difference of 0 or 360 degrees and the lowest at a phase difference of 180 degrees. Therefore, it is desired that a phase difference assumes a value of an integral number of times of 360 degrees.

Figure 18:
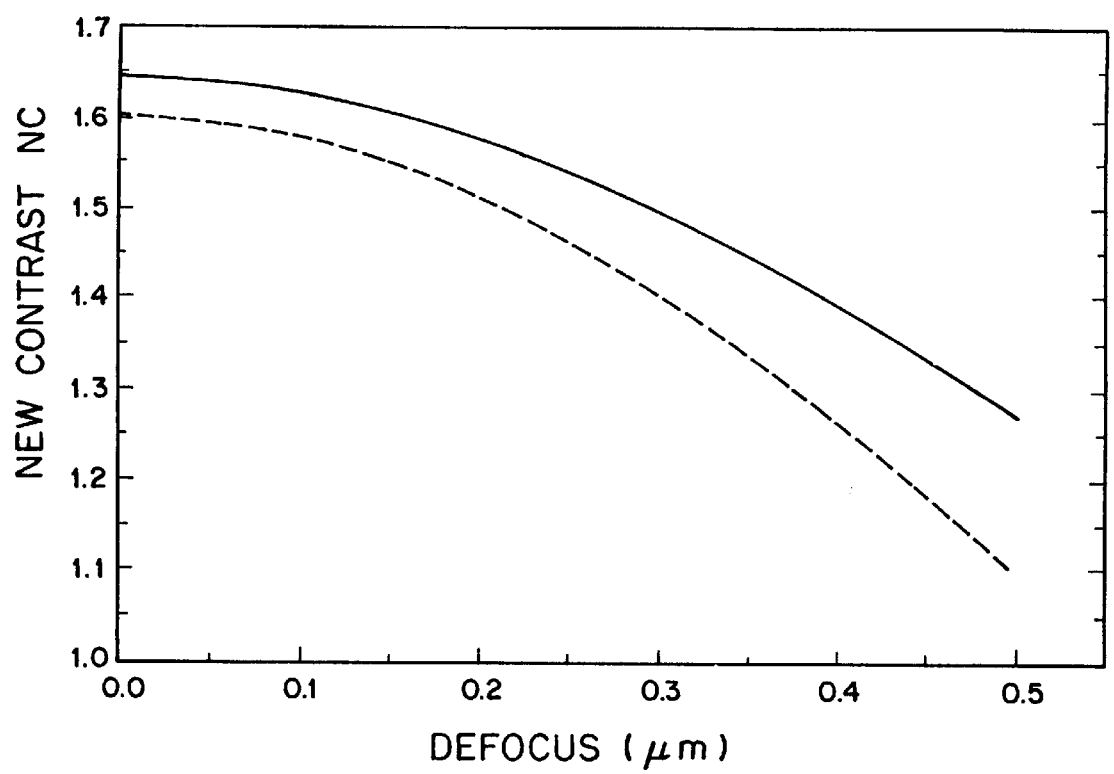
FIG. 18 is a graph showing a relation between the defocus and the new contrast NC on various photomasks.

A relation between the new contrast NC and the defocus will be described. FIG. 18 is a graph showing a relation between the defocus and the new contrast NC on various photomasks. FIG. 18 is a graph showing a relation between the defocus and the new contrast NC on various photomasks, wherein values of the defocus are plotted on the axis of abscissa and values of the new contrast NC are plotted on the axis of ordinate. In FIG. 18, a solid line indicates the case where a photomask of the present invention, which produces a phase shift of 360 degrees is used and a broken line indicates the case of an conventional photomask in which no auxiliary pattern regions are provided. As shown in FIG. 18, the values of new contrast NC are improved by providing an auxiliary pattern region.

For example, in the case where photosensitive resin is used in which a pattern region is resolved at a new contrast NC of 1.5 or more, a depth of focus is increase to +0.3 μm with use of a photomask of the embodiment, while a depth of focus is +0.2 μm with use of a conventional mask. Though it is not shown in the figure, since a similar trend can appear even when a defocus is negative, an actual depth of focus can be increased from ±0.2 μm to ±0.3 μm.

Figure 19A:
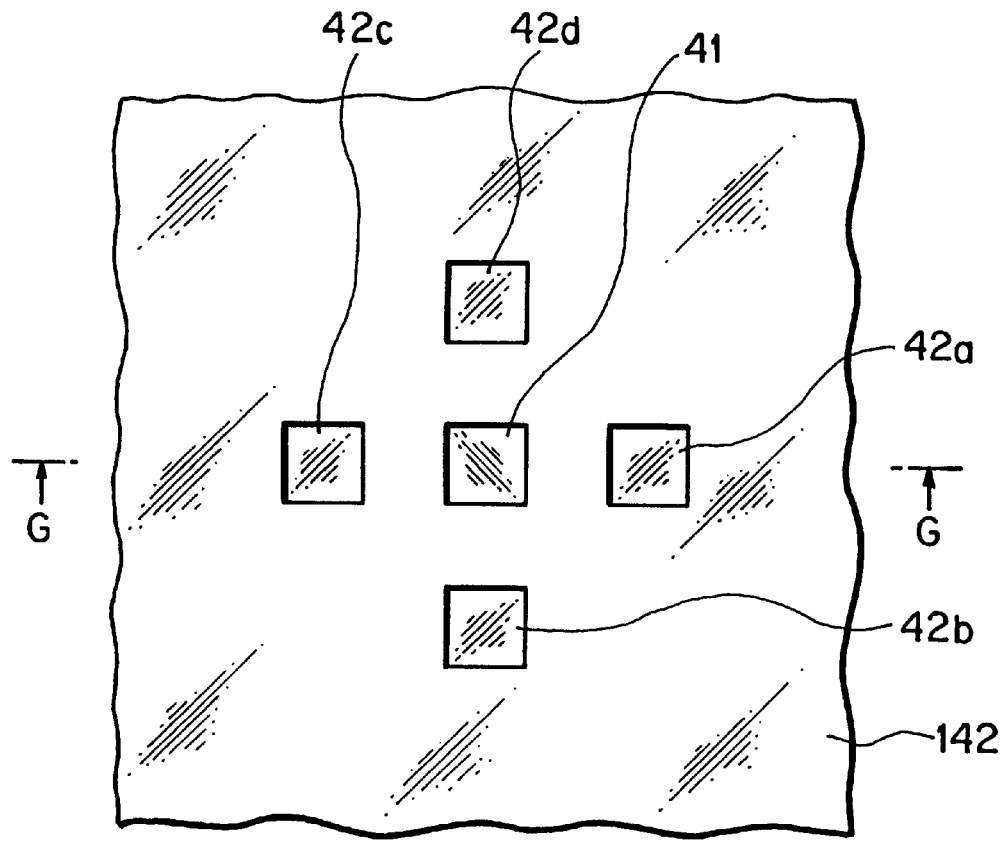
FIG. 19A is a plan view showing a structure of a photomask according to a fifth embodiment of the present invention and FIG. 19B is a sectional view taken on line G—G of FIG. 19A.
Figure 19B:
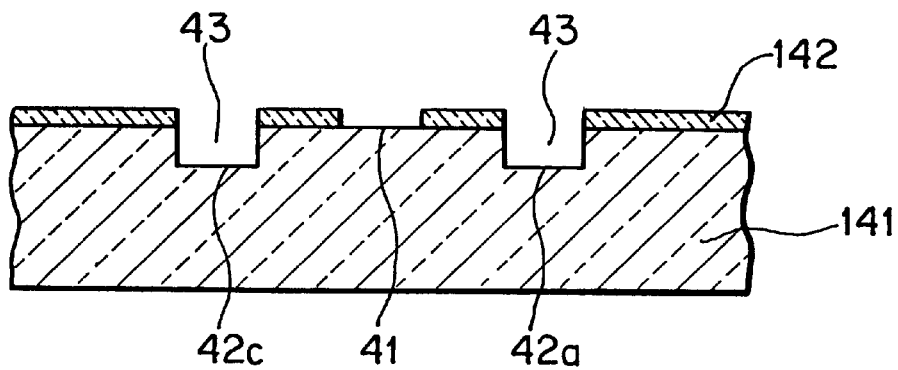

A photomask according to the fifth embodiment of the present invention will be described. FIG. 19A is a plan view showing a structure of a photomask according to a fifth embodiment of the present invention and FIG. 19B is a sectional view taken on line G—G of FIG. 19A. The fifth embodiment is a photomask for the same exposure equipment as that of the first embodiment. That is, exposure conditions are the same as those in the first embodiment. A pattern formed on photosensitive resin is an isolated pattern of 0.18 μm square.

In the fifth embodiment, a semitransparent film 142 made of chromium oxynitride is formed on a transparent substrate 141 made of synthetic quartz. A film thickness of the semitransparent film 142 is 120 nm and there arises a phase difference of 180 degrees between light transmitted through the semitransparent 142 and light not transmitted therethrough. A main pattern region 41 of 0.9 μm square is divided on the transparent substrate 141. Thereby, a hole pattern of 0.18 μm square is to be formed on an image plane.

Hole pattern regions each of 0.9 μm square constructed of four sides respectively parallel to four sides of the main pattern region 41 are divided in the outer periphery as auxiliary pattern regions 42*a*, 42*b*, 42*c* and 42*d* so that the hole pattern regions 42*a*, 42*b*, 42*c* and 42*d* are respectively opposed to the four sides of the main pattern region 41. A distance between the main pattern region 41 and any of the auxiliary pattern regions 42*a*, 42*b*, 42*c* and 42*d* is 0.9 am. As shown in FIG. 19B, the transparent substrate 142 is etched at the auxiliary pattern regions 42*a*, 42*b*, 42*c* and 42*d* each to a depth of, for example, 248 nm and an etching step portion 43 is formed. For this reason, in the case where excimer laser light of a wavelength of 248 nm is used, there arises a phase difference of 360 degrees between light transmitted through the auxiliary pattern regions 42*a*, 42*b*, 42*c* or 42*d* and light transmitted through the main pattern region 41.

In this embodiment, since a combination of a phase shift mask of a half tone type and annular illumination method is applied, a depth of focus can further be improved. Besides, as in the first embodiment, the auxiliary pattern regions 42*a*, 42*b*, 42*c* and 42*d* are not transferred because of an influence of the side wall of the etching step portion 43.

In this embodiment, too, it is desired that a phase difference between light transmitted through the main pattern region 41 and light transmitted through the auxiliary pattern regions 42*a*, 42*b*, 42*c* and 42*d* is a value of an integral number of times as large as 360 degrees except for 0. A phase difference, for example 720, 1080 degrees or the like, may be produced by adjusting a depth of the etching step portion.

In the case where a phase shift mask of a half tone type is used in combination with an auxiliary pattern method, too, an upper limit of a size of an auxiliary pattern at which the auxiliary pattern is not transferred is changed according to exposure conditions, a shape of a pattern and a pattern size. For this reason, it is necessary to confirm the upper limit of the size in each condition within the range of 0.7 to 1 times of a size of the main pattern region. Generally, it is desired to use auxiliary pattern regions each of substantially the same size as that of a main pattern region in the case where a depth of focus is short and a size of each of the auxiliary pattern regions is a size of a fine pattern near the limit of required resolution.

Figure 20A:
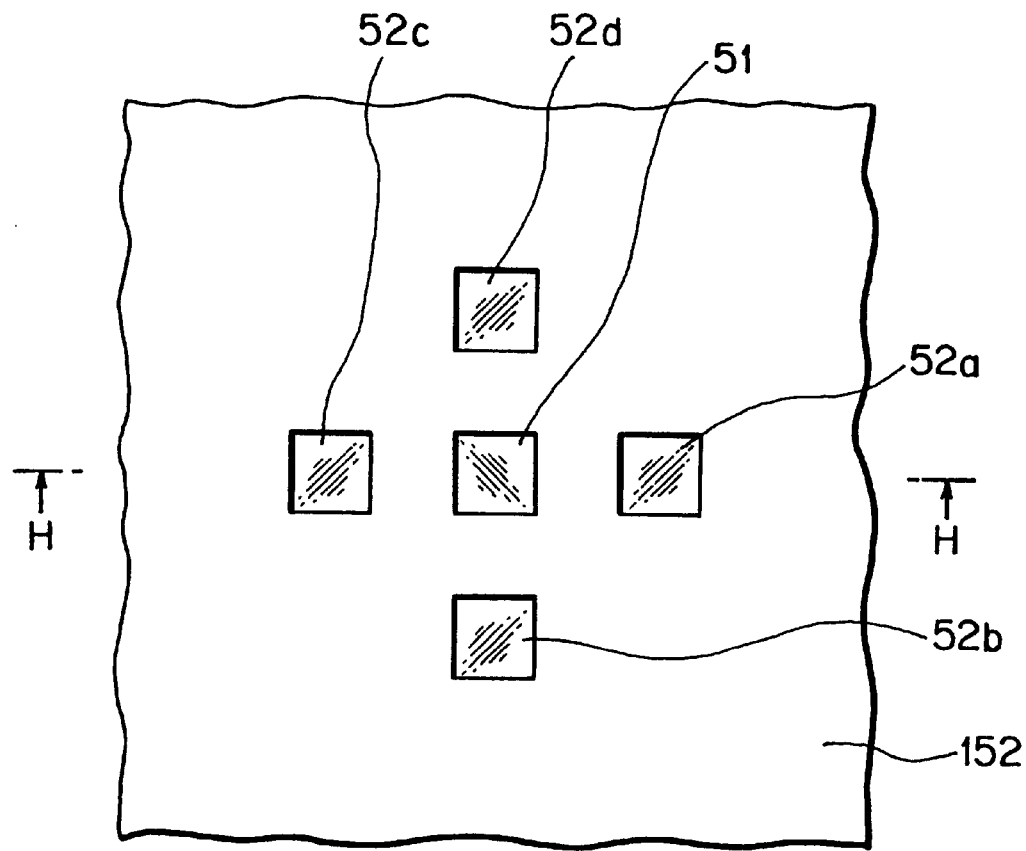
FIG. 20A is a plan view showing a structure of a photomask according to a sixth embodiment of the present invention and FIG. 20B is a sectional view taken on line H—H of FIG. 20A.
Figure 20B:
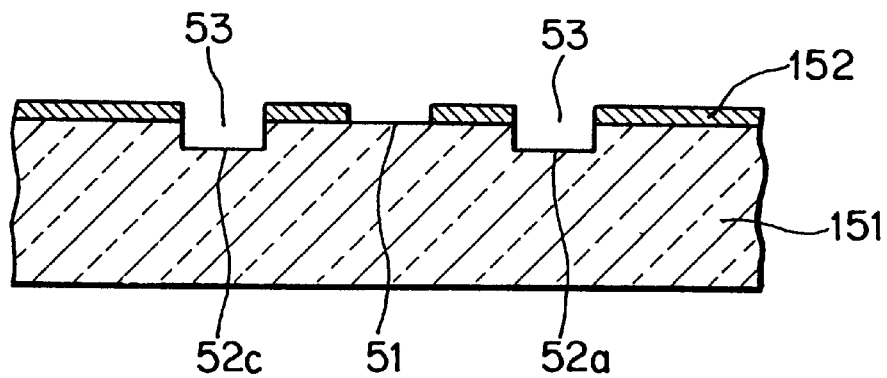

A photomask according to the sixth embodiment of the present invention will be described. FIG. 20A is a plan view showing a structure of a photomask according to a sixth embodiment of the present invention and FIG. 20B is a sectional view taken on line H—H of FIG. 20A. The sixth embodiment is a photomask for use in a projection equipment with an numerical aperture NA of 0.55 and a coherence factor σ of 0.36. A pattern formed in photosensitive resin is a isolated hole pattern of 0.20 μm square.

In the sixth embodiment, a light intercepting film 152 made of chromium is formed on a transparent 151 made of quartz as shown in FIG. 20A and 20B. A main pattern region 51 of 1 μm square is divided on the transparent substrate 151. Thereby, an isolated hole pattern of 0.2 μm square is to be formed on an image plane.

Hole pattern regions each of 1 μm square constructed of four sides respectively parallel to four sides of the main pattern region 51 are partitioned in the outer periphery as auxiliary pattern regions 52a, 52b, 52c and 52d so that the hole pattern regions 52a, 52b, 52c and 52d are respectively opposed to the four sides of the main pattern region 51. A distance between the main pattern region 51 and any of the auxiliary pattern regions 52a, 52b, 52c and 52d is 1 μm. As shown in FIG. 20B, the transparent substrate 151 is etched at the auxiliary pattern regions 52a, 52b, 52c and 52d each to a depth of, for example, 248 nm and an etching step portion 53 is formed. For this reason, in the case where KrF excimer laser light of a wavelength of 248 nm is used, there arises a phase difference of 360 degrees between light transmitted through the auxiliary pattern regions 52a, 52b, 52c or 52d and light transmitted through the main pattern region 51. That is, the embodiment is an application of a so-called Shibuya-Levenson type phase shift mask.

Figure 21:
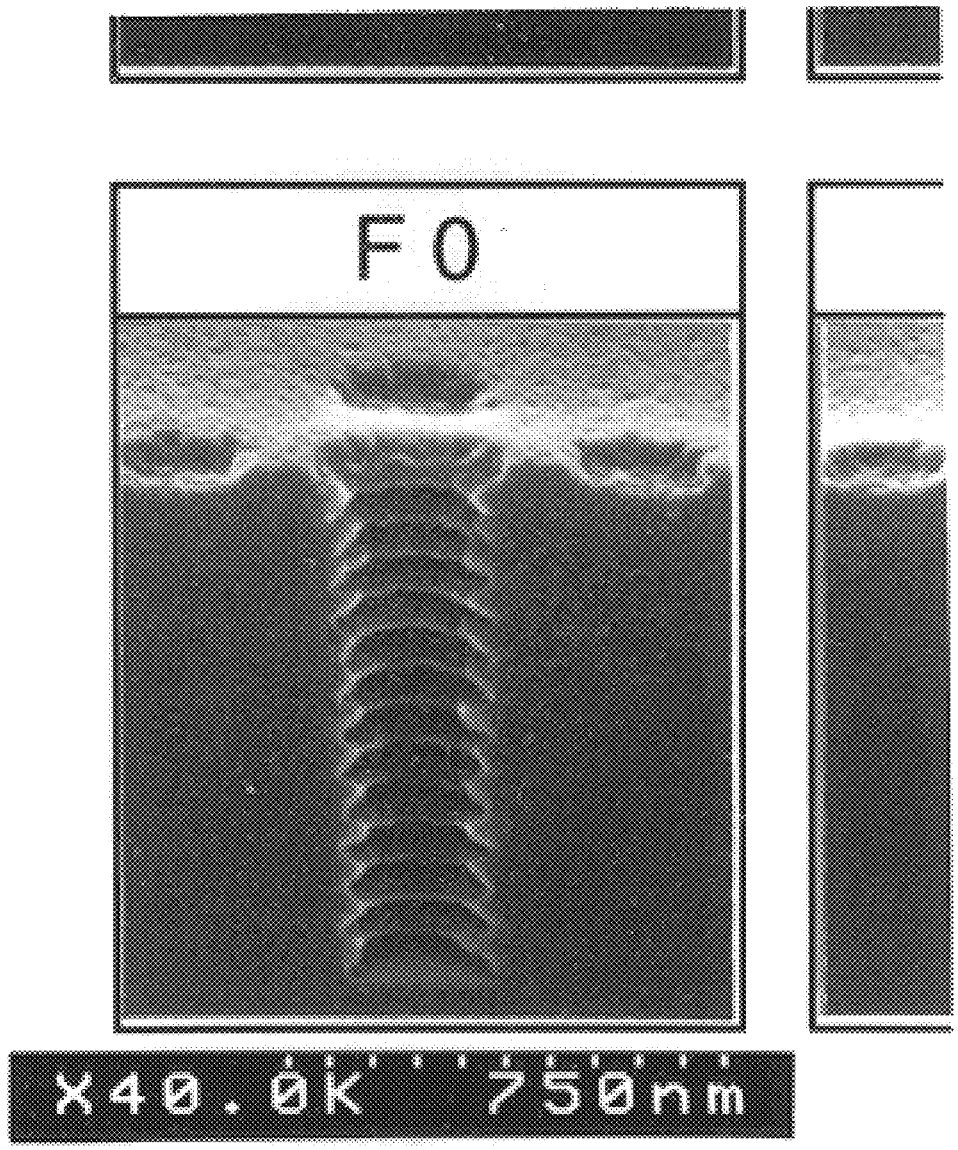
FIG. 21 is a SEM photograph showing a pattern transferred to photosensitive resin with use of a photomask according to the sixth embodiment.

FIG. 21 is a SEM photograph showing a pattern transferred to photosensitive resin with use of a photomask according to the sixth embodiment. FIG. 21 shows a pattern when a coherence factor σ is set 0.4 in order to obtain an effect of a phase shift mask of a Shibuya-Levenson type. As shown in FIG. 21, the auxiliary patterns 52a, 52b, 52c and 52d are almost not transferred as in the first embodiment and only the main pattern region 51 is transferred to form an isolated hole pattern.

Since the embodiment is an application of a phase shift mask of a Shibuya-Levenson type, a resolution and a depth of focus thereof is higher as compared with the first embodiment. In the exposure conditions, a depth of focus of 1.2 μm is obtained for a hole pattern of 0.2 μm and a hole pattern of 0.16 μm was able to be resolved.

In the exposure conditions of a low coherence factor σ as in the sixth embodiment, it is desired that a phase difference of an auxiliary pattern region is equal to or an odd number of times of 180 degrees.

Figure 22A:
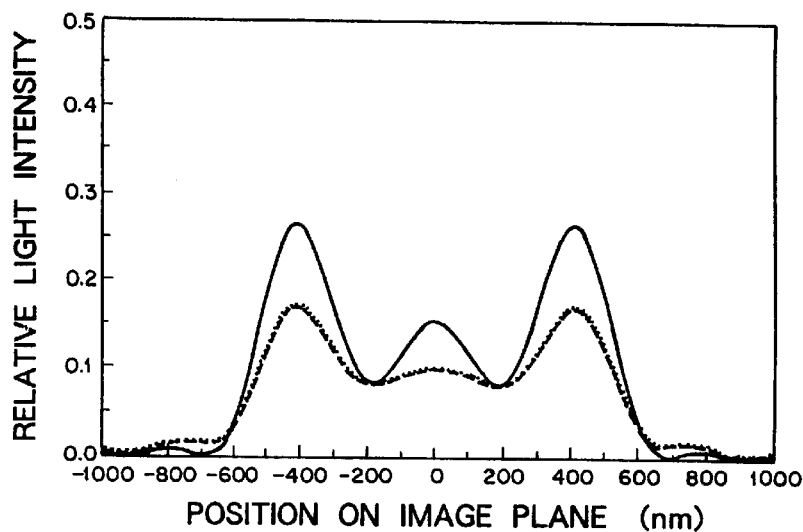
FIGS. 22A to 22F are graphs showing a relation between the defocus and the light intensity distribution in various phase differences.
Figure 22B:
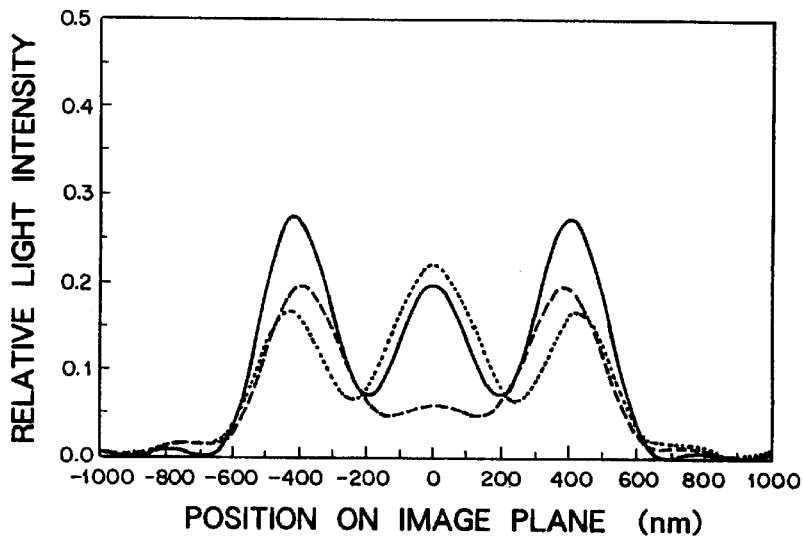
Figure 22C:
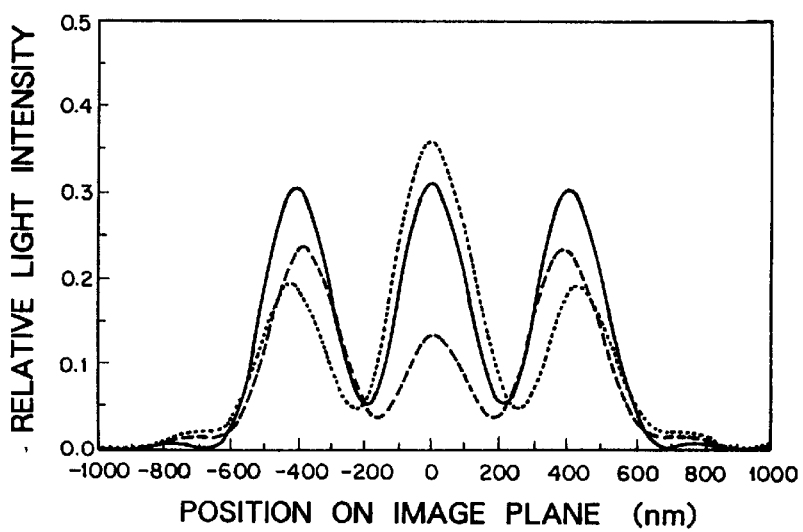
Figure 22D:
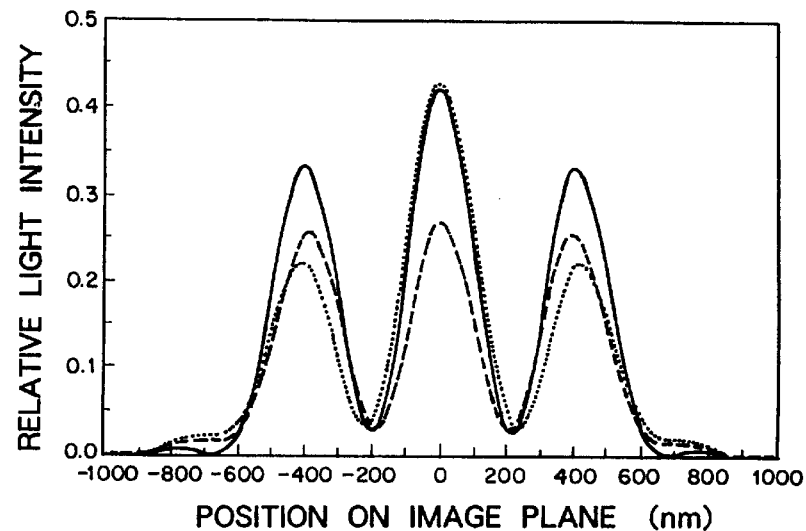
Figure 22E:
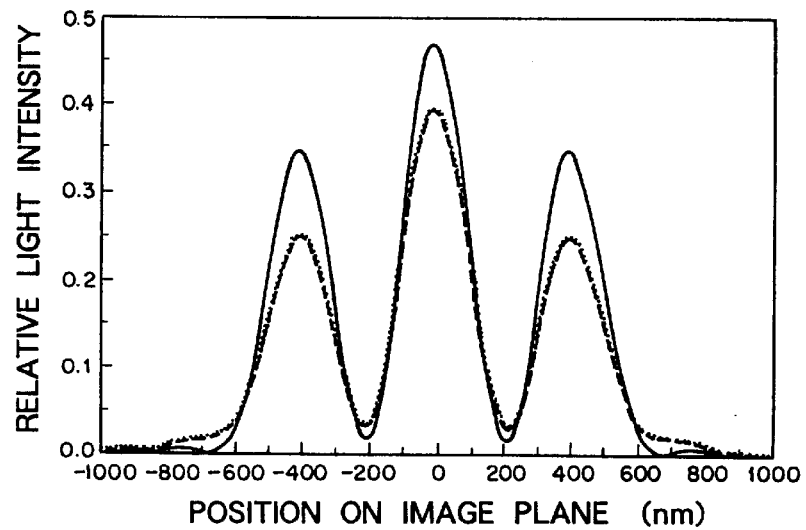
Figure 22F:
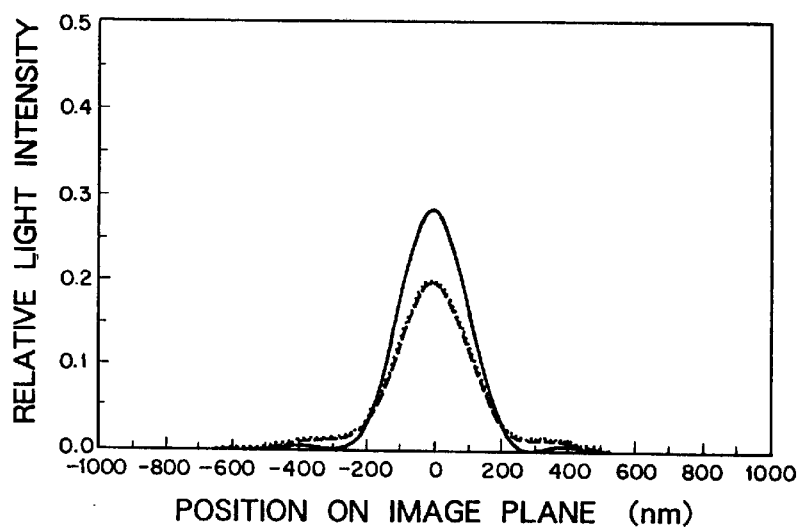

A relation between the defocus and the light intensity distribution will be described as in the first embodiment. FIGS. 22A to 22F are graphs showing a relation between the defocus and the light intensity distribution in various phase differences, wherein positions on an image plane are plotted on the axis of abscissa and values of the relative light intensity are plotted on the axis of ordinate. FIGS. 22A to 22E respectively show the cases of phase differences of 0, 45, 90, 135, 180 degrees in that order and FIG. 22F shows an comparative example in which no auxiliary pattern regions are provided. Besides, in FIGS. 22A to 22F, a solid line shows the best focus, a broken line shows a defocus of −0.5 μm and a dotted line shows a defocus of +0.5 μm. In the embodiment, the sharpest image has been obtained in the case of a phase difference of 180 degrees.

A relation between the new contrast NC and the phase difference in the embodiment will be described. FIG. 23 is a graph showing a relation between the phase difference and the new contrast NC in various defocus conditions, wherein values of the phase difference between light transmitted through a main pattern region and light transmitted through an auxiliary pattern region are plotted on the axis of abscissa and values of the new contrast NC are plotted on the axis of ordinate. In FIG. 23, a solid line indicates the best focus, a broken line indicates a defocus of −0.5 μm and a dotted line indicates a defocus of +0.5 μm. As shown in FIG. 23, in the case of the best focus, a new contrast NC is the highest at a phase difference of 180 degrees as well. Therefore, in exposure conditions of a low coherence factor σ as in the embodiment, a depth of focus can be the maximum when a phase difference assumes a value of an odd number of times as large as 180 degrees, such as 180, 540 and the like. That is, the steepest transferred image can be obtained when a phase difference assumes a value of an odd number of times as large as 180 degrees.

Figure 24:
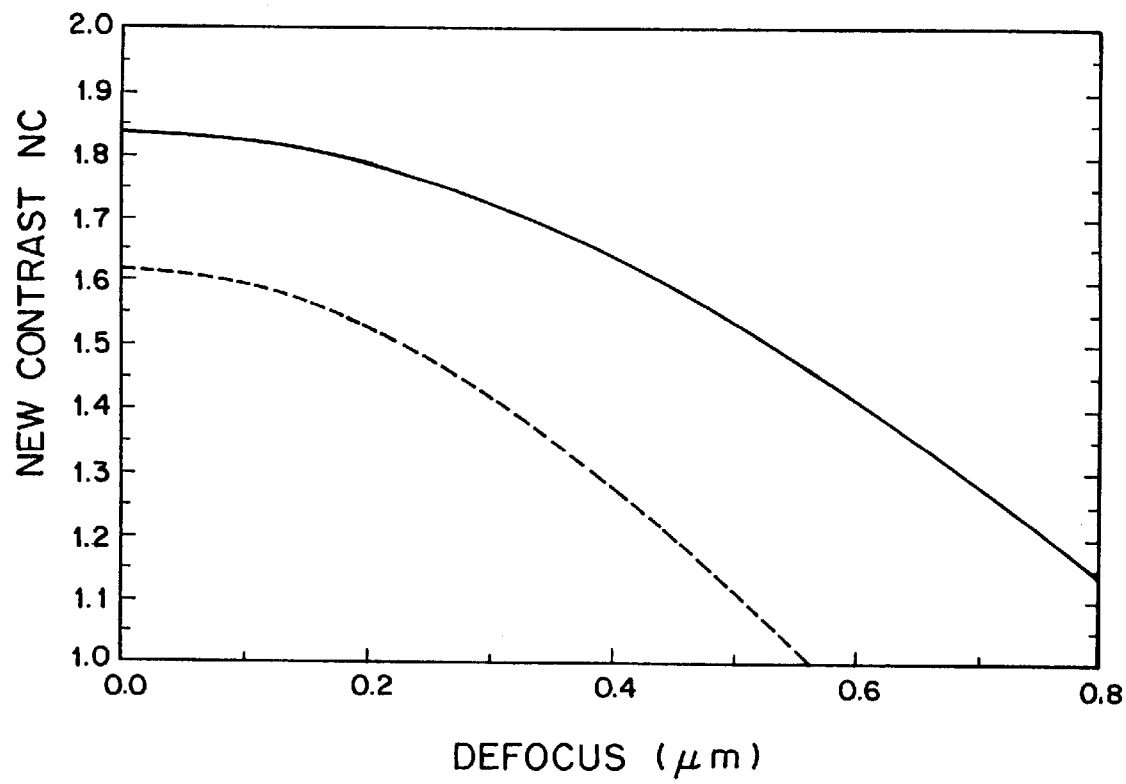
FIG. 24 is a graph showing a relation between the defocus and the new contrast NC on various photomasks.

A relation between the new contrast NC and the defocus in the embodiment will be described. FIG. 24 is a graph showing a relation between the defocus and the new contrast NC on various photomasks, wherein values of the defocus are potted on the axis of abscissa and values of the new contrast NC are plotted on the axis of ordinate. In FIG. 24, a solid line indicates the case of a photomask of the embodiment in which a phase of 180 degrees arises, a broken line shows the case of a conventional photomask in which no auxiliary patters are not provided. In the embodiment, too, in the case where photosensitive resin with which a pattern can be resolved at a new contrast NC of 1.5 or more, a depth of focus is increased by a great margin to ±0.53 μm for a photomask of the embodiment, while a depth of focus is ±0.23 μm for an ordinary photomask.

In the case where a phase shift mask of a Shibuya-Levenson type is applied with an auxiliary pattern method as in the embodiment, too, an upper limit of a size of an auxiliary pattern region at which the region is not transferred is changed according to exposure conditions, a pattern shape and a pattern size. For this reason, it is necessary to confirm an upper limit thereof in each condition within about the range of 0.7 to 1 times of that of a main pattern region. Generally, it is desired to use auxiliary pattern regions each of substantially the same size as that of a main pattern region in the case where a depth of focus is short and a size of each of the auxiliary pattern regions is a size of a fine pattern near the limit of required resolution.

What is claimed is:

1. A photomask used for a projection exposure equipment comprising;
   a transparent substrate, said transparent substrate having:
      a main pattern region; and
   an auxiliary pattern region provided in a periphery of said main pattern region, said auxiliary pattern region being etched to a depth at which a phase difference arises between light transmitted through said main pattern and light transmitted through said auxiliary pattern, said phase difference being of substantially an integral number of times as 360 degrees, and said integral number being one selected from the group consisting of integral numbers of one or more and integral numbers of minus one or less; and
   a light intercepting film provided on said transparent substrate, said light intercepting film having openings on said main pattern region and on said auxiliary pattern region.

2. A photomask used for a projection exposure equipment according to claim 1, wherein a width of said auxiliary pattern region is 0.7 times or more as large as that of said main pattern region.

3. A photomask used for a projection exposure equipment according to claim 1, wherein said transparent substrate comprises plural said main pattern regions arranged in a grid like shape and plural said auxiliary pattern regions provided in a periphery of plural said main pattern regions.

4. A photomask used for a projection exposure equipment according to claim 1, wherein said transparent substrate comprises plural said main pattern regions arranged in a row and plural said auxiliary pattern regions provided in a periphery of plural said main pattern regions.

5. A photomask used for a projection exposure equipment according to claim 1, wherein said transparent substrate is made of quartz.

6. A photomask used for a projection exposure equipment according to claim 1, wherein said light intercepting film contains chromium.

7. A photomask used for a projection exposure equipment according to claim 2, wherein a size of said auxiliary pattern region is substantially same as that of said main pattern region.

8. A photomask used for a projection exposure equipment comprising:
- a transparent substrate, said transparent substrate having:
  - a main pattern region; and
  - an auxiliary pattern region provided in a periphery of said main pattern region, said auxiliary pattern region being etched to a depth at which a phase difference arises between light transmitted through said main pattern and light transmitted through said auxiliary pattern, said phase difference being of substantially an integral number of times 360 degrees, and said integral number being one selected from the group consisting of integral numbers of one or more and integral numbers of minus one or less; and
- a semitransparent film provided on said transparent substrate, said semitransparent film having openings on said main pattern region and on said auxiliary pattern region, and a phase difference of substantially 180 degrees being produced between light transmitted through the air and light transmitted through said semitransparent film.

9. A photomask used for a projection exposure equipment according to claim 8, wherein a width of said auxiliary pattern is 0.7 times or more as large as that of said main pattern.

10. A photomask used for a projection exposure equipment according to claim 8, wherein said transparent substrate is made of quartz.

11. A photomask used for a projection exposure equipment according to claim 8, wherein said semitransparent film contains chromium oxynitride.

12. A photomask used for a projection exposure equipment according to claim 9, wherein a size of said auxiliary pattern region is substantially same as that of said main pattern region.

13. A photomask used for a projection exposure equipment comprising:
- a transparent substrate, said transparent substrate having:
  - a main pattern region; and
  - an auxiliary pattern region provided in a periphery of said main pattern region, said auxiliary pattern region being provided at all sides of said main pattern region and being etched to a depth at which a phase difference arises between light transmitted through said main pattern and light transmitted through said auxiliary region, and said phase difference being of substantially odd numbers of times 180 degrees; and
- a light intercepting film provided on said transparent substrate, said light intercepting film having openings on said main pattern region and on said auxiliary pattern region.

14. A photomask used for a projection exposure equipment according to claim 13, wherein a width of said auxiliary pattern is 0.7 times or more as large as that of said main pattern.

15. A photomask used for a projection exposure equipment according to claim 13, wherein said transparent substrate is made of quartz.

16. A photomask used for a projection exposure equipment according to claim 13, wherein said light intercepting film contains chromium.

17. A photomask used for a projection exposure equipment according to claim 13, wherein a size of said auxiliary pattern region is substantially same as that of said main pattern region.

* * * * *

UNITED STATES PATENT AND TRADEMARK OFFICE
CERTIFICATE OF CORRECTION

PATENT NO. : 6,004,699  Page 1 of 1
DATED : December 21, 1999
INVENTOR(S) : Tadao Yasuzato and Shinji Ishida It is certified that error appears in the above-identified patent and that said Letters Patent is hereby corrected as shown below:

Column 20,
Line 54, remove "as"

Signed and Sealed this

Second Day of July, 2002

Attest:

JAMES E. ROGAN
Attesting Officer  Director of the United States Patent and Trademark Office